United States Patent
Lee et al.

(10) Patent No.: US 11,842,778 B2
(45) Date of Patent: Dec. 12, 2023

(54) MEMORY SYSTEM FOR PERFORMING CACHE PROGRAM OPERATION AND OPERATING METHOD THEREOF

(71) Applicant: SK hynix Inc., Gyeonggi-do (KR)

(72) Inventors: Jae Young Lee, Gyeonggi-do (KR); Yong Hwan Hong, Gyeonggi-do (KR); Byung Ryul Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 174 days.

(21) Appl. No.: 17/383,174

(22) Filed: Jul. 22, 2021

(65) Prior Publication Data

US 2022/0270694 A1 Aug. 25, 2022

(30) Foreign Application Priority Data

Feb. 24, 2021 (KR) .................. 10-2021-0025105

(51) Int. Cl.
  *G11C 16/34* (2006.01)
  *G11C 16/10* (2006.01)
  *G11C 7/10* (2006.01)
  *G11C 29/44* (2006.01)
  *G11C 16/26* (2006.01)

(52) U.S. Cl.
  CPC ........ *G11C 16/3459* (2013.01); *G11C 7/1057* (2013.01); *G11C 7/1063* (2013.01); *G11C 16/102* (2013.01); *G11C 16/26* (2013.01); *G11C 29/4401* (2013.01)

(58) Field of Classification Search
  None
  See application file for complete search history.

(56) References Cited

U.S. PATENT DOCUMENTS

2007/0180186 A1* 8/2007 Cornwell .............. G06F 12/023
  711/170

FOREIGN PATENT DOCUMENTS

KR 10-2020-0029085 A 3/2020

* cited by examiner

*Primary Examiner* — Alfredo Bermudez Lozada
(74) *Attorney, Agent, or Firm* — IP & T GROUP LLP

(57) ABSTRACT

A memory device includes a memory block including a plurality of pages, a peripheral circuit configured to perform a first program operation for storing first page data and a second program operation for storing second page data after the first program operation, a status register configured to store status information, a cache program operation controller configured to control the peripheral circuit to load the second page data from an external controller when the first program operation is being performed, and a status register controller configured to store in the status register first failure information indicating whether the first program operation passes, store in the status register validity information indicating whether the first failure information is valid information within a predetermined time period from when the second program operation starts, and provide the external controller with the status information including the first failure information and the validity information.

20 Claims, 14 Drawing Sheets

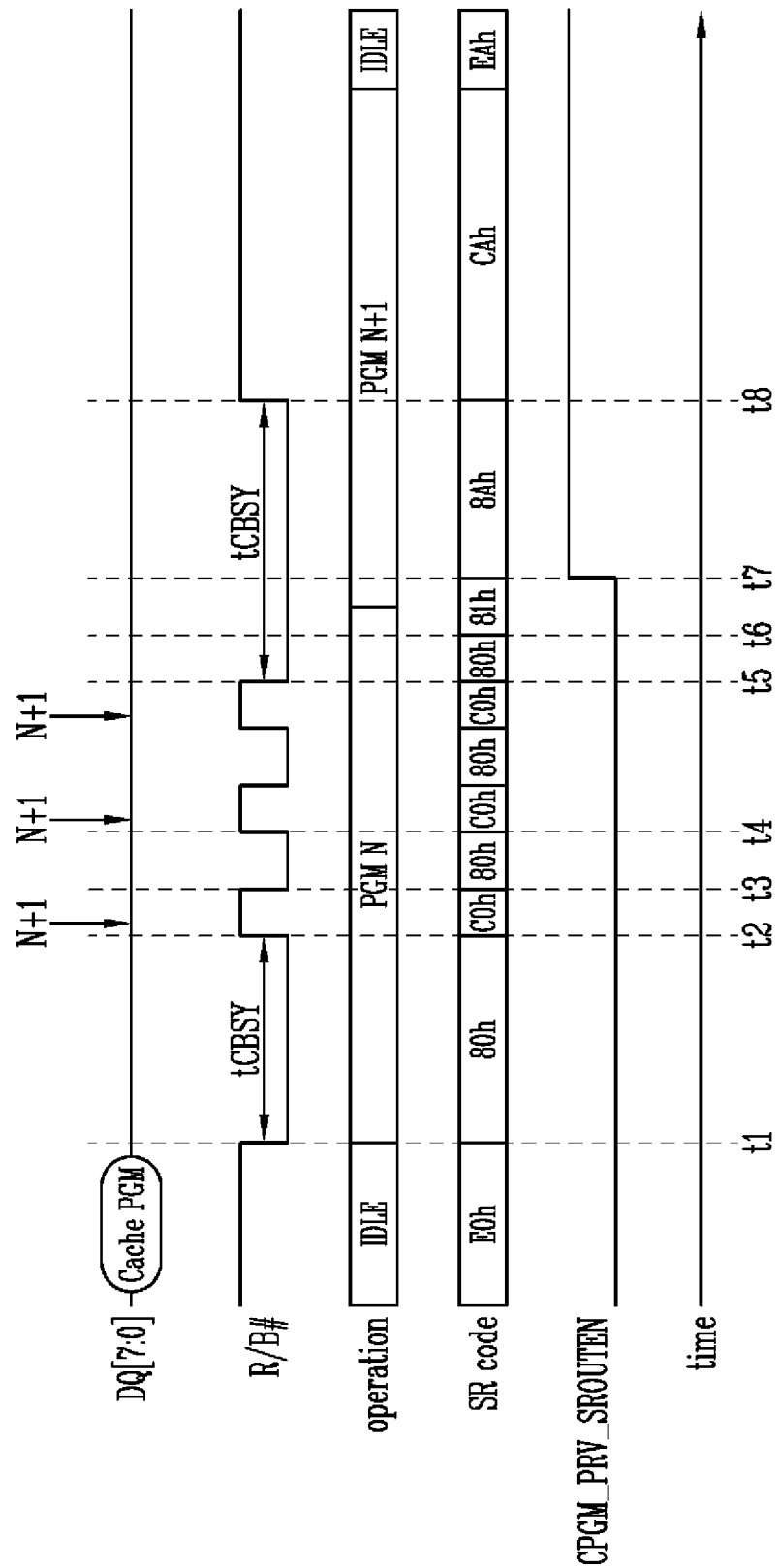

MEMORY SYSTEM FOR PERFORMING CACHE PROGRAM OPERATION AND OPERATING METHOD THEREOF

CROSS-REFERENCE TO RELATED APPLICATION

The present application claims priority under 35 U.S.C. § 119(a) to Korean patent application number 10-2021-0025105, filed on Feb. 24, 2021, and which is incorporated herein by reference in its entirety.

BACKGROUND

Field of Invention

Various embodiments of the present disclosure generally relate to an electronic device, and more particularly, to a memory system including a memory device and an operating method thereof.

Description of Related Art

A memory system is a device storing data in response to control of a host device such as a computer or a smartphone. The memory system may include a memory device storing data and a memory controller controlling the memory device. Generally, there are two types of memory devices: volatile memory devices and nonvolatile memory devices.

The volatile memory device may store data only when power is supplied thereto, and may lose stored data in the absence of a power supply. Examples of the volatile memory device include a Static Random Access Memory (SRAM) device, a Dynamic Random Access Memory (DRAM) device, and the like.

The nonvolatile memory device may retain stored data even when a supply of power is interrupted or blocked. Examples of the nonvolatile memory device include a Read Only Memory (ROM) device, a Programmable ROM (PROM) device, an Electrically Programmable ROM (EPROM) device, an Electrically Erasable and Programmable ROM (EEPROM) device, a flash memory device, and the like.

SUMMARY

Various embodiments of the present disclosure are directed to a memory system including a memory device that more quickly provides whether a cache program operation passes or fails and a method of operating the memory system.

According to one embodiment, a memory device may include a memory block including a plurality of pages, a peripheral circuit configured to perform a first program operation for storing first page data in a first page among the plurality of pages and perform a second program operation for storing second page data in a second page among the plurality of pages after the first program operation, a status register configured to store status information including information related to each of the first program operation and the second program operation, a cache program operation controller configured to control the peripheral circuit to load the second page data from an external controller when the first program operation is being performed, and a status register controller configured to store first failure information indicating whether the first program operation passes or fails in the status register, store validity information indicating whether the first failure information is valid information in the status register within a predetermined time period from when the second program operation starts, and provide the external controller with the status information including the first failure information and the validity information.

According to another embodiment, a memory controller configured to control a memory device including a plurality of pages may include a data buffer configured to temporarily store page data to be stored in the memory device, and a processor configured to provide the memory device with first page data to be stored in a first page among the plurality of pages, provide the memory device with second page data to be stored in a second page when the first page data is being stored, and obtain status information indicating an internal state of the memory device from the memory device before the second page data is stored. The status information may include failure information indicating whether a program operation for storing the first page data passes or fails and validity information indicating whether the failure information is valid or invalid.

According to another embodiment, a memory system may include a memory device configured to when a first program operation for storing first data in a selected page among a plurality of pages is being performed, load second data to be stored in a next page of the selected page and perform a second program operation for storing the loaded data in the next page after the first program operation, and a memory controller configured to obtain status information including first failure information indicating whether the first program operation passes or fails and validity information indicating whether the first failure information is valid information from the memory device within a predetermined time period from when the second program operation starts.

BRIEF DESCRIPTION OF THE DRAWINGS

FIG. 7 is a waveform diagram illustrating an operation of a memory device;

DETAILED DESCRIPTION

Specific structural and functional features of the present disclosure are disclosed in the context of the following embodiments of the disclosure. However, the present disclosure may be configured, arranged, or carried out differently than disclosed herein. Thus, the present disclosure is not limited to any particular embodiment nor to any specific details. Also, throughout the specification, reference to "an embodiment," "another embodiment" or the like is not necessarily to only one embodiment, and different references to any such phrase are not necessarily to the same embodiment. Moreover, the use of an indefinite article (i.e., "a" or "an") means one or more, unless it is clear that only one is intended. Similarly, terms "comprising," "including," "having" and the like, when used herein, do not preclude the existence or addition of one or more other elements in addition to the stated element(s).

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

It is further noted, that in the various drawings, like reference numbers designate like elements.

Figure 1:
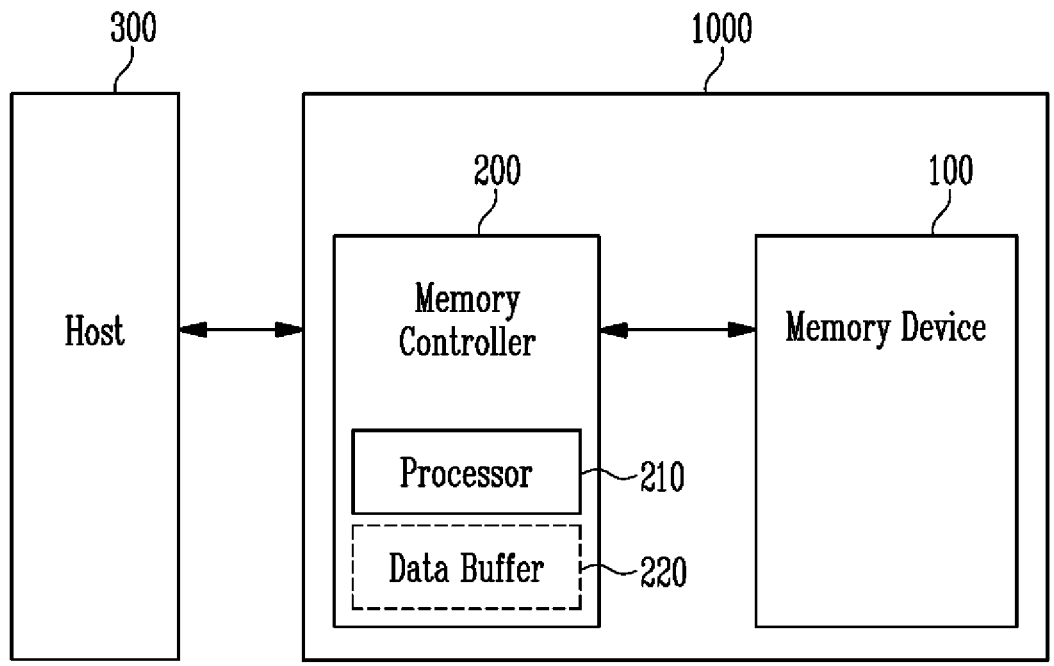
FIG. 1 is a diagram illustrating a memory system according to one embodiment of the present disclosure.

FIG. 1 is a diagram illustrating a memory system 1000 according to one embodiment of the present disclosure.

Referring to FIG. 1, the memory system 1000 according to this embodiment of the present disclosure may include a memory device 100 and a memory controller 200.

The memory system 1000 may store data or provide the stored data in response to a request from a host 300. The memory system 1000 may refer to a storage device performing an operation related to the data. The operation related to the data may include at least one or more operations of storing the data, reading and providing the stored data, and erasing the stored data.

To perform the above-described operations, the memory system 1000 may provide a signal to or receive a signal from the host 300 through various communication methods of a wired communication or a wireless communication. The memory system 1000 may be configured as one of various types of storage devices according to a host interface corresponding to a communication method with the host 300. The memory system 1000 may be configured as one of various types of storage devices such as a solid state drive (SSD), a multimedia card in the form of a multimedia card (MMC), an embedded MMC (eMMC), a Reduced-Size MMC (RS-MMC), and a micro-MMC, a secure digital card in the form of a secure digital (SD) card, a mini-SD card, and a micro-SD card, a Universal Serial Bus (USB) storage device, a Universal Flash Storage (UFS) device, a Personal Computer Memory Card International Association (PCM-CIA) card type storage device, a peripheral component interconnection (PCI) card type storage device, a PCI Express (PCI-e) card type storage device, a compact flash (CF) card, a smart media card, and a memory stick.

The memory system 1000 may be manufactured as one of various kinds of package types. The memory system 1000 may be manufactured as one of various kinds of package types such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may operate in response to control of the memory controller 200. The memory device 100 may refer to a device storing data.

The memory device 100 may perform an operation corresponding to a command when the memory device 100 receives the command from the memory controller 200. The command may be one or more of program, read, and erase commands.

For example, in a program operation, when the memory device 100 receives the program command, an address, and data from the memory controller 200, the memory device 100 may store the data in an area selected by the address according to the program command. In a read operation, when the memory device 100 receives the read command and an address from the memory controller 200, the memory device 100 may provide the data stored in the area selected by the address to the memory controller 200 (or the host 300) according to the read command. In an erase operation, when the memory device 100 receives the erase command and an address from the memory controller 200, the memory device 100 may erase the data stored in the area selected by the address according to the erase command.

According to one embodiment, the memory device 100 may be embodied as one of NAND flash memory, vertical NAND flash memory, NOR flash memory, Static Random Access Memory (SRAM), Dynamic RAM (DRAM), Synchronous Dynamic RAM (SDRAM), Double Data Rate (DDR) SDRAM, Low Power DDR (LPDDR) SDRAM, Graphics DRAM (GDRAM), Rambus Dynamic RAM (RDRAM), Ferro electric RAM (FeRAM), magnetoresistive RAM (MRAM), Phase-Change Memory (PCM), Spin-Transfer Torque Magnetoresistive RAM (STT-RAM), and Resistive RAM (ReRAM). By way of example, it is assumed that the memory device 100 is NAND flash memory in the context of the following description.

The memory controller 200 may control general operations of the memory system 1000 or the memory device 100.

When power is applied to the memory system 1000, the memory controller 200 may execute instructions such as firmware (FW). The firmware (FW) may include a Host Interface Layer (HIL) controlling a communication with the host 300, a Flash Translation Layer (FTL) controlling a communication between the host 300 and the memory device 100, and a Flash Interface Layer (FIL) controlling a communication with the memory device 100.

The memory controller 200 may include a processor 210 and a data buffer 220.

The processor 210 may control the memory device 100. According to one embodiment, the processor 210 may control the memory device 100 according to a request received from the host 300. According to another embodiment, the processor 210 may control the memory device 100 independently of a request from the host 300.

The processor 210 may control the memory device 100 to perform one or more of program, read, and/or erase operations. For example, in the program operation, the processor 210 may provide a program command, an address, and data to the memory device 100. In the read operation, the processor 210 may provide a read command and an address to the memory device 100. In the erase operation, the processor 210 may provide an erase command and an address to the memory device 100.

The data buffer 220 may temporarily store page data to be stored in the memory device 100. The page data may refer to data stored in units of pages by the program operation. The data buffer 220 may temporarily store the data read from the memory device 100 by the read operation.

The host 300 may communicate with the memory system 1000 using at least one of various communication standards, interfaces, or methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI Express (PCI-e), NonVolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The host 300 may be one of various electronic devices such as a cellular phone, a smartphone, an MP3 player, a laptop computer, a desktop computer, a game player, television, a tablet PC, an in-vehicle infotainment system, or a wearable device.

The processor 210 may control the memory device 100 to perform a cache program operation. The cache program operation may refer to a method in which the memory device 100 simultaneously performs the program operation and an operation for loading page data used for performing a next program operation. In some embodiments, the page data may be loaded from the memory controller 200 to the memory device 100. The cache program operation is performed to reduce the time taken to perform the program operation. The cache program operation is described below in more detail with reference to FIGS. 5, 6A, and 6B.

When the memory device 100 has completed the program operation, the processor 210 may check whether the program operation passes or fails. The processor 210 may check whether the program operation passes or fails based on failure information output from the memory device 100. The failure information may indicate whether the program operation passes or fails (that is, a pass or a fail) as a result of performing the program operation. Depending on whether the program operation passes or fails, the processor 210 may perform an additional operation. For example, when it is identified that the program operation fails, the processor 210 may control the memory device 100 to store page data in another page.

According to a conventional cache program operation, failure information for checking whether a previous program operation passes or fails is processed as valid information only after a busy state where data cannot be received is changed to a ready state where data can be received. The failure information is processed as the valid information (i.e., when the busy state is changed to the ready state) after a next program operation has proceeded over a predetermined level (for example, 50%). Accordingly, a concern of delaying an operation subsequent to the program operation occurs.

According to one embodiment of the present disclosure, the memory device 100 and the memory controller 200 can have the capability for processing failure information about whether a cache program operation passes or fails into valid information more quickly than the conventional cache program operation described above, and the memory system 1000 including the memory device 100 and the memory controller 200 may be provided with this capability. Hereinafter, the memory system 1000 is described in more detail with reference to attached drawings.

Figure 2:
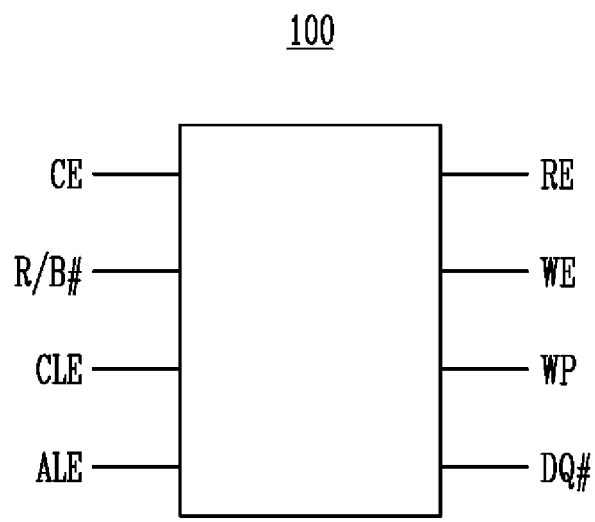
FIG. 2 is a diagram illustrating a pin configuration of a memory device shown in FIG. 1.

FIG. 2 is a diagram illustrating a pin configuration of the memory device 100 shown in FIG. 1.

Referring to FIG. 2, the memory device 100 may receive a signal from an external device or output the signal to the external device through a plurality of pins. The external device may be the memory controller 200 or the host 300.

According to one embodiment, when a high signal is input to a Chip Enable (CE) pin, a state of the memory device 100 may be changed to a low-power standby state. When a low signal is input to the CE pin, the memory device 100 may be selected.

According to one embodiment, the memory device 100 may identify a type of a signal (for example, a command, an address, or data) input to the memory device 100 through a data input/output (DQ #) pin based on a signal input to a Command Latch Enable (CLE) pin and an Address Latch Enable (ALE) pin.

According to one embodiment, when a high signal is input to a Read Enable (RE) pin, the memory device 100 may output data read according to a read operation through the data input/output (DQ #) pin. When a high signal is input to a Write Enable (WE) pin, the memory device 100 may receive data to be stored according to a program operation through the data input/output (DQ #) pin.

According to one embodiment, the memory device 100 may output a Ready/Busy signal (R/B #), which indicates whether an operation state of the memory device 100 is a ready state or a busy state, through a Ready/Busy pin. When a signal is input to a Write Protection (WP) pin, the memory device 100 may inactivate a program operation and/or an erase operation.

According to one embodiment, the memory device 100 may receive or output data such as a command, an address, or page data through the data input/output (DQ #) pin. In addition, the memory device 100 may output status information, which indicates an internal state of the memory device 100, through the data input/output (DQ #) pin.

Figure 3:
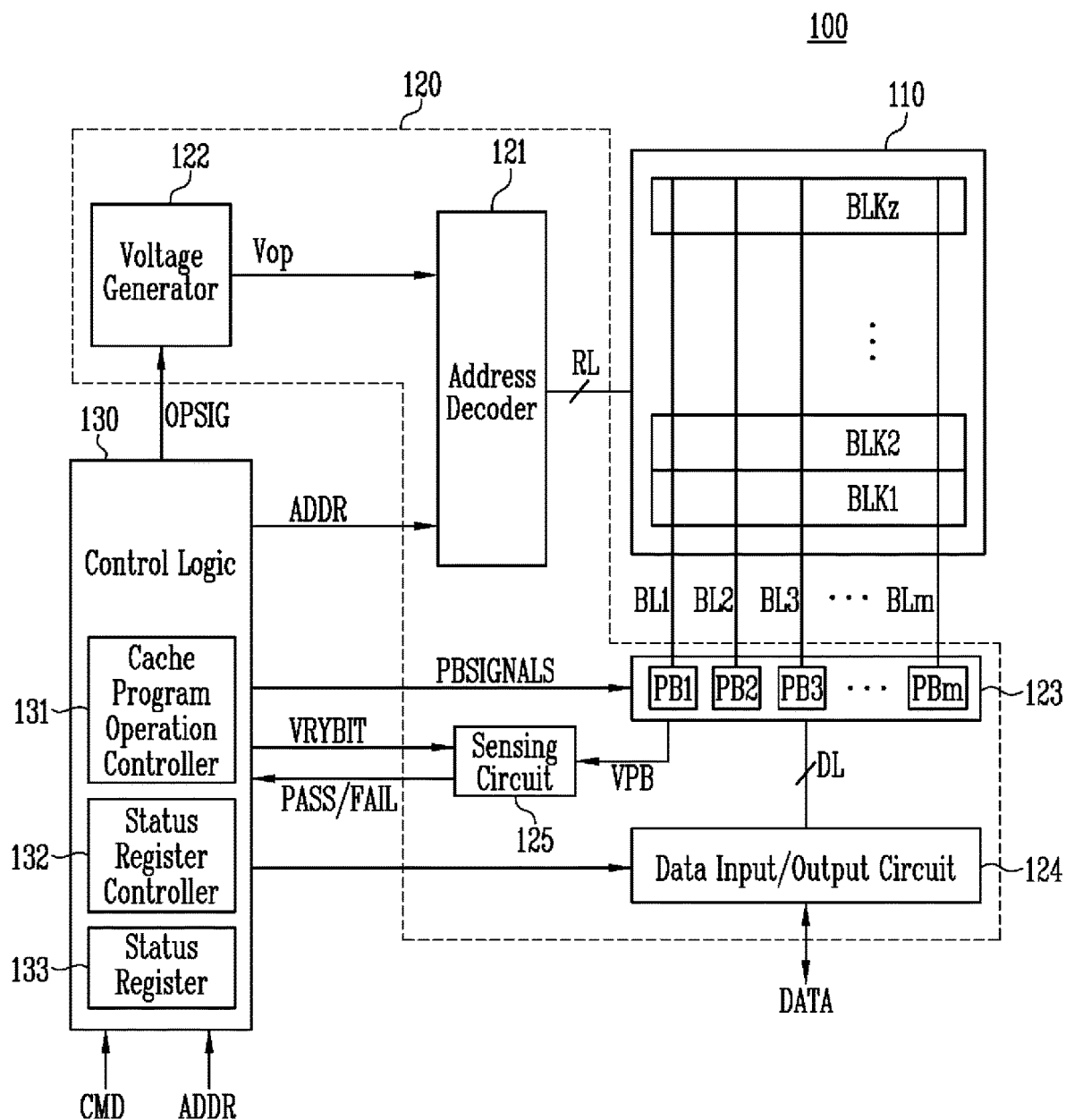
FIG. 3 is a diagram illustrating a structure of a memory device shown in FIG. 1.

FIG. 3 is a diagram illustrating a structure of the memory device 100 of FIG. 1.

Referring to FIG. 3, the memory device 100 may include a memory cell array 110, a peripheral circuit 120, and control logic 130.

The memory cell array 110 may include a plurality of memory blocks BLK1 to BLKz. Because the plurality of memory blocks BLK1 to BLKz have the same configuration, one of the plurality of memory blocks BLK1 to BLKz (that is, the memory block BLKi; please refer to FIG. 4) is described below.

The memory block BLKi may be coupled to an address decoder 121 of the peripheral circuit 120 through a row line RL. The memory block BLKi may be coupled to a read and write circuit 123 of the peripheral circuit 120 through bit lines BL1 to BLm.

The memory block BLKi may include a plurality of pages. Each of the plurality of pages (or a memory block) may include a plurality of memory cells. According to one embodiment, each of the plurality of memory cells may be a nonvolatile memory element. Each of the plurality of memory cells may store data according to a Single-Level Cell (SLC) method for storing one bit of data, a Multi-Level Cell (MLC) method for storing two bits of data, a Triple-Level Cell (TLC) method for storing three bits of data, or a Quad-Level Cell (QLC) method for storing four bits of data. This is described below in more detail with reference to FIG. 4.

Figure 4:
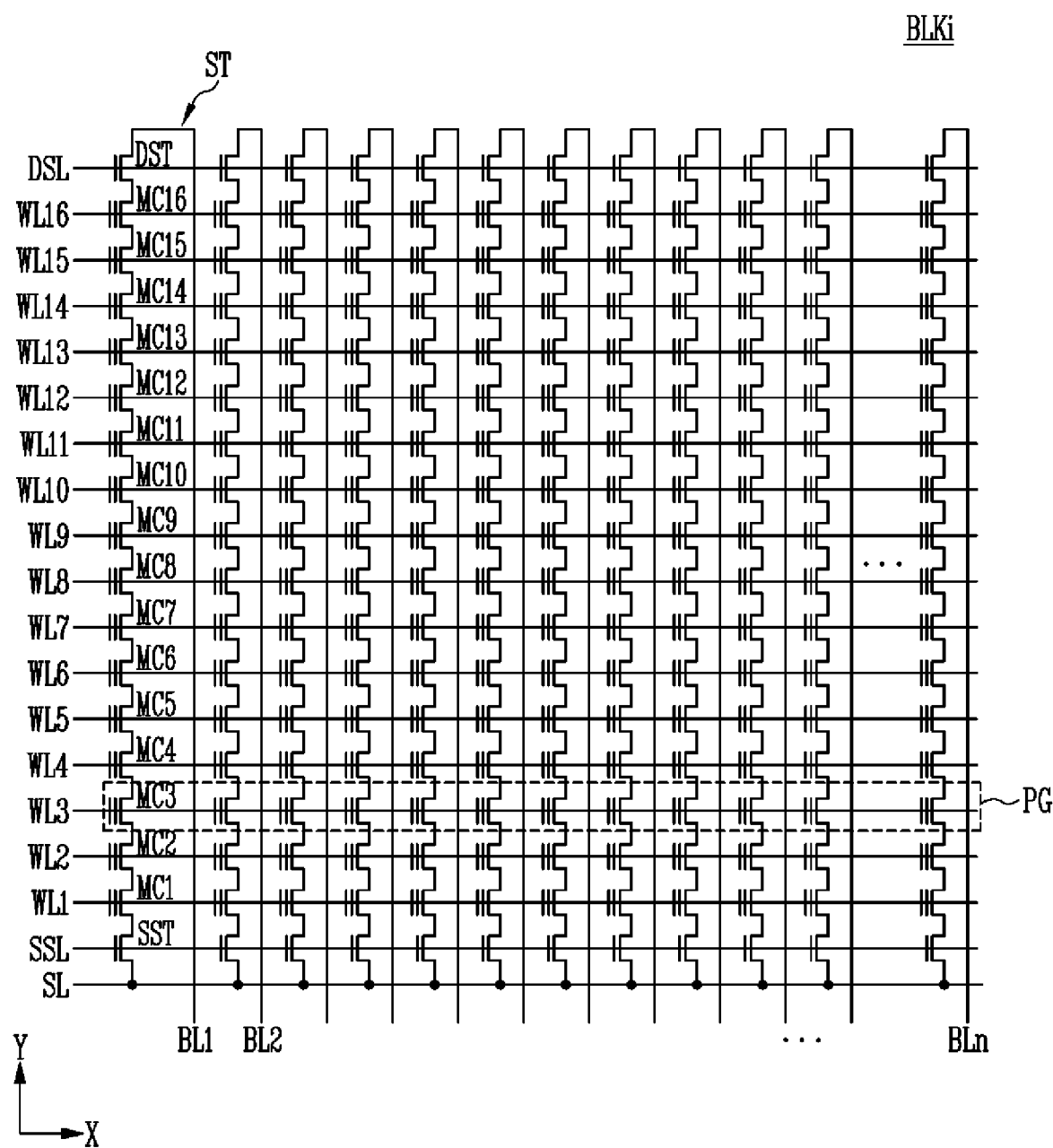
FIG. 4 is a diagram illustrating a structure of a memory block shown in FIG. 3.

FIG. 4 is a diagram illustrating a structure of the memory block BLKi shown in FIG. 3.

Referring to FIG. 4, the memory block BLKi may include a plurality of strings. The plurality of strings may be coupled to a plurality of bit lines BL1 to BLn in a one-to-one manner and may be commonly coupled to a source line SL. Because the plurality of strings may have the same configuration, a string ST coupled to the first bit line BL1 is described in more detail as an example.

The string ST may include a source select transistor SST, a plurality of memory cells MC1 to MC16, and a drain select transistor DST coupled in series between the source line SL and the first bit line BL1. According to one embodiment, the string ST may include at least one source select transistor SST, at least one drain select transistor DST, and more memory cells than the memory cells MC1 to MC16 as shown in FIG. 4.

Gates of the source select transistors SST may be coupled to a source select line SSL and gates of the drain select transistors DST may be coupled to a drain select line DSL. A source of the source select transistor SST may be coupled to the source line SL and a drain of the drain select transistor DST may be coupled to the first bit line BL1.

Gates of the plurality of memory cells MC1 to MC16 may be coupled to a plurality of word lines WL1 to WL16 in a one-to-one manner. The plurality of memory cells MC1 to MC16 may be coupled in series to and between the source select transistor SST and the drain select transistor DST.

A group of memory cells coupled to the same word line may be defined as one physical page PG. In other words, the memory block BLKi may include a plurality of physical pages (simply, a plurality of pages). Therefore, the memory block BLKi may include as many physical pages PG as the number of the word lines WL1 to WL16. One physical page PG may store data of one logical page DATA. The data of one logical page DATA may include as many data bits as the number of cells included in one physical page PG. When one memory cell is capable of storing two or more bits of data, one physical page PG may store data of two or more logical pages DATA. Hereinafter, for convenience of explanation, the physical page PG is simply referred to as the page PG and the data of the logical page DATA is simply referred to as the page data DATA.

According to one embodiment, the page PG may be a unit of performing a program operation or a unit of performing a read operation. The memory block BLKi may be a unit of performing an erase operation.

Referring back to FIG. 3, the peripheral circuit 120 may drive the memory cell array 110. For example, the peripheral circuit 120 may drive the memory cell array 110 so that the memory cell array 110 performs one or more of program, read, and/or erase operations.

According to one embodiment, the program operation of the memory device 100 may be performed by an Incremental Step Pulse Program (ISPP) method by which a program voltage is applied to a word line in a plurality of stages. The program operation of the memory device 100 by the ISPP method is described below with reference to FIG. 5. Consecutive program operations may be performed by a normal program method and a cache program method. The consecutive program operations by the normal and cache program methods are described below with reference to FIGS. 6A and 6B.

The peripheral circuit 120 may include the address decoder 121, a voltage generator 122, the read and write circuit 123, a data input/output circuit 124, and a sensing circuit 125.

The address decoder 121 may be coupled to the memory cell array 110 through the row line RL. The row line RL may include the drain select line DSL, the word lines WL1 to WL16, the source select line SSL, and the source line SL described above with reference to FIG. 4. For example, the address decoder 121 may include components such as a row decoder, a column decoder, and an address buffer.

The address decoder 121 may operate in response to control of the control logic 130. For example, the address decoder 121 may receive an address ADDR from the control logic 130. The address decoder 121 may decode a block address of the received address ADDR. The address decoder 121 may select at least one of the memory blocks BLK1 to BLKz according to the decoded block address. The address decoder 121 may decode a row address of the received address ADDR. The address decoder 121 may select at least one of word lines of the memory block according to the decoded row address. According to one embodiment, the address decoder 121 may decode a column address of the received address ADDR. The address decoder 121 may couple the read and write circuit 123 to the data input/output circuit 124 according to the decoded column address.

The address decoder 121 may apply an operating voltage Vop provided from the voltage generator 122 to the selected word line of the memory block selected according to the address.

For example, during a program operation, the address decoder 121 may apply a program voltage to the selected word line and a pass voltage having a lower level than the program voltage to unselected word lines. During a program verify operation, the address decoder 121 may apply a verify voltage to the selected word line and a verify pass voltage having a higher level than the verify voltage to unselected word lines. During a read operation, the address decoder 121 may apply a read voltage to the selected word line and a read pass voltage having a higher level than the read voltage to unselected word lines. During an erase operation, the address decoder 121 may apply a ground voltage to a word line included in the selected memory block. In other words, the erase operation of the memory device 100 may be performed in units of memory blocks.

The voltage generator 122 may generate the plurality of operating voltages Vop using an external power voltage supplied to the memory device 100. According to one embodiment, the voltage generator 122 may generate the plurality of operating voltages Vop using the external power voltage or an internal power voltage. For example, the voltage generator 122 may generate a plurality of erase voltages, a plurality of program voltages, a plurality of pass voltages, a plurality of selected read voltages, and a plurality of unselected read voltages.

The read and write circuit 123 may include a plurality of page buffers PB1 to PBm. For example, the first to mth page buffers PB1 to PBm may be coupled to the memory cell array 110 through the first to mth bit lines BL1 to BLm in a one-to-one manner. The plurality of page buffers PB1 to PBm may receive page data DATA from or output page data DATA to the data input/output circuit 124.

In the program operation, the plurality of page buffers PB1 to PBm may receive the page data DATA to be stored in the memory device 100 from the data input/output circuit 124 through a data line DL. When a program voltage is applied to the selected word line, the plurality of page buffers PB1 to PBm may transfer the received page data DATA to a selected memory cell through the bit lines BL1 to BLm. In the read operation, the read and write circuit 123 may read the page data DATA stored in a memory cell included in a selected page through a bit line and store the read page data DATA in the plurality of page buffers PB1 to PBm. In the erase operation, the read and write circuit 123 may float the bit line of the selected memory block.

The data input/output circuit 124 may be coupled to the first to mth page buffers PB1 to PBm through the data lines DL. The data input/output circuit 124 may operate in response to control of the control logic 130.

The data input/output circuit 124 may include a plurality of input/output buffers (not shown) receiving the input page data DATA. In the program operation, the data input/output circuit 124 may receive the page data DATA from the memory controller 200 and transfer the received page data DATA to the read and write circuit 123. In the read operation, the data input/output circuit 124 may receive the page data DATA from the plurality of page buffers PB1 to PBm included in the read and write circuit 123 and output the received page data DATA to the memory controller 200.

In the program operation, the sensing circuit 125 may generate a reference voltage in response to an allowable bit VRYBIT signal generated by the control logic 130 and output a pass or fail signal PASS/FAIL to the control logic 130 according to a result of comparing a sensing voltage VPB received from the read and write circuit 123 and the reference voltage.

The control logic 130 may be configured to control the general operations of the memory device 100. The control logic 130 may operate in response to a command CMD transferred from an external device (for example, the memory controller 200 or the host 300). The control logic 130 may be coupled to the address decoder 121, the voltage generator 122, the read and write circuit 123, the data input/output circuit 124, and the sensing circuit 125.

The control logic 130 may control the peripheral circuit 120 by generating various signals in response to the command CMD and the address ADDR. For example, the control logic 130 may generate an operation signal OPSIG, read and write circuit control signals PBSIGNALS, and the allowable bit VRYBIT in response to the command CMD and the address ADDR. The control logic 130 may output the operation signal OPSIG to the voltage generator 122, the address ADDR to the address decoder 121, the read and write circuit control signals PBSIGNALS to the read and write circuit 123, and the allowable bit VRYBIT to the sensing circuit 125. In addition, the control logic 130 may identify whether a program operation passes or fails in response to the pass or fail signal PASS/FAIL output from the sensing circuit 125.

According to one embodiment, the control logic 130 may include a cache program operation controller 131, a status register controller 132, and a status register 133.

The cache program operation controller 131 may control the peripheral circuit 120 to perform a cache program operation.

More specifically, the cache program operation controller 131 may control the peripheral circuit 120 to perform a first program operation for storing first page data in a first page among a plurality of pages. The cache program operation controller 131 may control the peripheral circuit 120 to receive second page data from an external controller when the first program operation for storing the first page data is being performed. The external controller may be the memory controller 200. After performing the first program operation, the cache program operation controller 131 may control the peripheral circuit 120 to perform a second program operation for storing the second page data in a second page among the plurality of pages.

For example, the cache program operation controller 131 may receive the cache program command CMD and the address ADDR from the memory controller 200. The cache program operation controller 131 may transfer the page data DATA received from the memory controller 200 through the data input/output circuit 124 to the plurality of page buffers PB1 to PBm included in the read and write circuit 123. The plurality of page buffers PB1 to PBm may store the transferred page data DATA. The cache program operation controller 131 may control the read and write circuit 123 of the peripheral circuit 120 to perform a program operation for storing the page data DATA stored in the plurality of page buffers PB1 to PBm in a page selected according to the received address ADDR.

By way of example, in the context of the following description, it is assumed that the first program operation is performed first and then the second program operation is performed in the cache program operation. The second program operation may refer to an (N+1)th program operation which is the lastly (or the most recently) performed program operation and the first program operation may refer to an Nth program operation which is a previously performed program operation of the lastly performed program operation.

The status register controller 132 may store first failure information indicating whether the first program operation passes or fails in the status register 133. For example, after performing the first program operation, the status register controller 132 may store the first failure information in the status register 133.

According to one embodiment, when the first program operation is completed within a predetermined time limit, the status register controller 132 may store the first failure information, which indicates that the first program operation for storing the first page data in the first page passes, in the status register 133. When the first program operation is not completed within the predetermined time limit, the status register controller 132 may store the first failure information, which indicates that the first program operation for storing the first page data in the first page fails, in the status register 133.

According to one embodiment, when a value of the first failure information is 0, it may indicate that the program operation passes; when a value of the first failure information is 1, it may indicate that the program operation fails. However, it is a mere example for explanation, and the values of the first failure information may also be set to be inversely matched to meanings indicating a pass or a fail.

The status register controller 132 may store validity information which indicates whether the first failure information is valid information in the status register 133 within a predetermined time period from a time point when the second program operation starts. For example, when the second program operation starts, the status register controller 132 may store the validity information which indicates whether the first failure information is valid information in the status register 133.

According to one embodiment, the predetermined time period may be a time period from a time point when the second program operation starts to a time point when a state of the peripheral circuit 120 is changed from a state incapable of loading data to a state capable of loading the data. In other words, the status register controller 132 may store the validity information which indicates whether the first failure information is valid information in the status register 133 at one time point within the predetermined time period. According to one embodiment, the predetermined time period may be a time period within a program cache busy time tCBSY of FIG. 7. For example, the time point when the second program operation starts may be a time point t7 of FIG. 7, and the time point when the state of the peripheral circuit 120 is changed from the state incapable of loading data to the state capable of loading the data may be a time point t8 of FIG. 7. According to one embodiment, while the data input/output circuit 124 receive the data from the memory controller 200 or the data input/output circuit 124 transfer the received data to the read and write circuit 123, the peripheral circuit 120 may be a state incapable of loading other data. According to one embodiment, after the data input/output circuit 124 receive the data from the memory controller 200 and transfer the received data to the read and write circuit 123, the peripheral circuit 120 may be a state capable of loading other data.

According to one embodiment, when a value of the validity information is 1, it indicates that the first failure information is valid information; when a value of the validity information is 0, it indicates that the first failure information is invalid information. However, it is a mere example for explanation, and the values of the validity information may also be set to be inversely matched to meanings indicating validity or invalidity.

The status register controller 132 may provide status information to an external controller. The external controller may be the memory controller 200. The status information may include the first failure information and the validity information.

The status register 133 may store the status information. According to one embodiment, the status register 133 may be implemented as a memory element capable of storing eight bits of information (or sixteen bits of information or the like). For example, the status register 133 may include at least one of volatile memory such as DRAM, SDRAM, DDR SDRAM, LPDDR SDRAM, and GRAM and nonvolatile memory such as FRAM, ReRAM, STT-MRAM, and PRAM.

The status information may include failure information and validity information. The failure information may indicate whether a program operation passes or fails. The validity information may indicate whether the failure information is valid information. For example, a first value (e.g., 1) of the validity information may indicate that the failure information is valid information. Alternatively, a second value (e.g., 0) of the validity information or a case where a value of the validity information does not exist (e.g., null) may indicate that the failure information is invalid information. Other than the failure information and the validity information, the status information may further include various types of subordinate information that indicate various internal states of the memory device 100.

The subordinate information of the status information may be stored in each bit of the status register 133. For example, a first bit of the status register 133 may store failure information indicating whether the lastly performed program operation passes or fails and a second bit of the status register 133 may store failure information indicating whether a previously performed program operation of the lastly performed program operation passes or fails. A third bit of the status register 133 may store validity information indicating whether the failure information stored in the second bit is valid information. This is described below in more detail with reference to FIG. 8.

According to one embodiment, after performing the first program operation, the status register controller 132 may store first failure information indicating whether the first program operation passes or fails in the first bit of the status register 133. When the second program operation starts, the status register controller 132 may store the first failure information stored in the first bit of the status register 133 in the second bit of the status register 133. The status register controller 132 may store validity information indicating whether the first failure information is valid information in the third bit of the status register 133. The status information may include the first failure information stored in the second bit of the status register 133 and the validity information stored in the third bit of the status register 133.

According to one embodiment, after performing the second program operation, the status register controller 132 may store second failure information indicating whether the second program operation passes or fails in the first bit of the status register 133. The status information may further include the second failure information stored in the first bit of the status register 133. Thereafter, when a third program operation is performed according to the cache program operation which proceeds, the status register controller 132 may repeat the above-described operations including storing the second failure information stored in the first bit of the status register 133 in the second bit of the status register 133 and the like.

According to one embodiment, when the status register controller 132 receives a status read command requesting status information from the memory controller 200, the status register controller 132 may provide the status information to the memory controller 200 in response to the status read command. The memory controller 200 may identify whether the failure information stored in the second bit of the status register 133 is valid based on the validity information stored in the third bit of the status register 133 among information included in the status information, and when it is identified that the failure information is valid, the memory controller 200 may identify whether the first program operation passes or fails based on the failure information stored in the second bit of the status register 133.

According to one embodiment, the status register controller 132 may include a mask signal generating circuit and a validity information generating circuit. The mask signal generating circuit may generate a mask signal indicating that the first failure information is invalid during a time period between when the second page data is received and when the first failure information is stored in the second bit of the status register 133. In other words, the mask signal informs memory controller 200 that any validity information in the status register 133 available during this time period is not to be used, i.e., it should be masked off from use. The validity information generating circuit may generate validity information based on a cache program signal indicating progress status of the first program operation or the second program operation, and the mask signal. This is described below in more detail with reference to FIGS. 9 and 10.

In the conventional art, when ready information RDY (please refer to FIG. 8) included in the status information indicates a busy state, the memory controller 200 regards the failure information which indicates whether a program operation passes or fails as invalid information and ignores the failure information, and after the ready information RDY indicates a ready state, the memory controller 200 processes the failure information which indicates whether the program operation passes or fails as valid information. According to this embodiment of the present disclosure, validity or invalidity of failure information may be processed in a shorter time by using validity information but not the ready information RDY. Therefore, according to this embodiment of the present disclosure, a time taken to determine whether a program operation passes or fails and to perform an operation subsequent to the program operation according to the determination result may be reduced.

Referring back to FIG. 1, the memory controller 200 is described in more detail.

The memory controller 200 may include the processor 210 and the data buffer 220.

The processor 210 may provide the first page data to be stored in the first page among the plurality of pages to the memory device 100. According to one embodiment, the processor 210 may provide the program command for performing the cache program operation, the address corresponding to the first page of the memory device 100, and the first page data to the memory device 100. When the memory device 100 completely receives the program command, the address, and the first page data, the memory device 100 may perform a program operation for storing the first page data in the first page corresponding to the address (the first program operation).

The processor 210 may provide the second page data to be stored in the second page to the memory device 100 when the first page data is being stored. According to one embodiment, the processor 210 may provide the address corresponding to the second page of the memory device 100 and the second page data to the memory device 100 when the program operation for storing the first page data (the first program operation) is being performed. When the memory device 100 completes the first program operation and completely receives the second page data, the memory device 100 may perform a program operation for storing the second page data in the second page corresponding to the address (the second program operation).

The processor 210 may obtain status information indicating an internal state of the memory device 100 from the memory device 100 before the second page data is stored. The status information may include failure information indicating whether the program operation for storing the first page data passes or fails and validity information indicating whether the failure information is valid. For example, a first value (e.g., 1) of the validity information indicates that the failure information is valid information. Alternatively, a second value (e.g., 0) of the validity information or a case where a value of the validity information does not exist (e.g., null) indicates that the failure information is invalid information. The description of "before the second page data is stored" in the preceding sentence may refer to a time point before the memory device 100 finishes the program operation for storing the second page data (the second program operation).

According to one embodiment, the processor 210 may provide the memory device 100 with a status read command requesting status information. The processor 210 may obtain the status information provided in response to the status read command.

According to one embodiment, the processor 210 may obtain the status information provided in response to the status read command within a predetermined time period. The predetermined time period may refer to a time period from a time point when the second program operation for storing the second page data in the second page of the memory device 100 starts to a time point when a state of the memory device 100 is changed from a state incapable of loading data to a state capable of loading the data. In other words, a time point when the predetermined time period starts may refer to the time point when the second program operation for storing the second page data in the memory device 100 starts (or a time point that can be considered equivalent to thereto) and a time point when the predetermined time period ends may refer to the time point when the state of the memory device 100 is changed from the state incapable of loading data to the state capable of loading the data (or a time point that can be considered equivalent to thereto).

According to another embodiment, the validity information may have a value indicating that the failure information is invalid before the second program operation starts in the memory device 100. In addition, the validity information may be changed to have a value indicating that the failure information is valid when the second program operation starts in the memory device 100.

When the processor 210 obtains the status information of the memory device 100 at one time point within the predetermined time period, the validity information included in the status information may have a value indicating that the failure information is valid.

According to another embodiment, when the validity information indicates that the failure information is valid and the failure information indicates that the program operation for storing the first page data fails, the processor 210 may provide the memory device 100 with a program command instructing that the first page data should be stored in another page among the plurality of pages, and the first page data. For example, the processor 210 may provide the memory device 100 with the program command, an address corresponding to another page (that is, a page different from the first and second pages), and the first page data. The memory device 100 may perform a program operation for storing the first page data in another page corresponding to the received address.

According to another embodiment, when the validity information indicates that the failure information is valid and the failure information indicates that the program operation for storing the first page data passes, the processor 210 may control the data buffer 220 to remove the first page data stored in the data buffer 220. The first page data stored in the data buffer 220 may be removed because the first page data is successfully stored in the memory device 100, and thus the first page data need not be stored in the data buffer 220 any longer.

As described above, according to one embodiment of the present disclosure, a pass or a fail of a program operation may be identified more quickly than the conventional art and perform an operation subsequent to the program operation without a delay. In particular, according to another embodiment of the present disclosure, a time point at which whether a pass or a fail of the program operation is identified in a cache program method may be made as early as a time point in a normal program method.

According to one embodiment, when the validity information indicates that the failure information is invalid, the processor 210 may provide the memory device 100 with the status read command again and obtain status information indicating an internal state of the memory device 100 as a response to the status read command. When the validity information is obtained before the second program operation starts in the memory device 100, the validity information may indicate that the failure information is invalid. Thereafter, the processor 210 may provide the memory device 100 with a new status read command and obtain new status information of the memory device 100 as a response to the new status read command. The processor 210 may repeatedly perform the above-described operations based on failure information and validity information included in the new status information.

The data buffer 220 may temporarily store page data to be stored in the memory device 100. The page data may refer to data to be stored in units of pages by the program operation. The data buffer 220 may temporarily store the data read from the memory device 100 by the read operation.

The data buffer 220 may be implemented as a volatile memory device such as a SRAM or DRAM device and a nonvolatile memory device such as a NAND flash memory device. According to one embodiment, the data buffer 220 may be included in the memory controller 200 as shown in FIG. 1. According to another embodiment, the data buffer 220 may be located outside the memory controller 200 and included in the memory system 1000. In other words, the memory system 1000 may include the data buffer 220.

According to one embodiment, the memory system 1000 including the memory device 100 and the memory controller 200 is described below.

When a first program operation for storing data in a selected page among a plurality of pages is being performed, the memory device 100 may load data to be stored in a next page of the selected page. After performing the first program operation, the memory device 100 may perform a second program operation for storing the loaded data in the next page.

The memory controller 200 may obtain status information including first failure information indicating whether the first program operation passes or fails and validity information indicating whether the first failure information is valid information from the memory device 100 within a predetermined time period from a time point when the second program operation starts. For example, a first value (e.g., 1) of the validity information indicates that the failure information is valid information. Alternatively, a second value (e.g., 0) of the validity information or a case where a value of the validity information does not exist (e.g., null) indicates that the failure information is invalid information. The predetermined time period may refer to a time period from a time point when the second program operation starts to a time point when a state of the memory device 100 is changed from a state incapable of loading data to a state capable of loading the data.

According to one embodiment, the memory device 100 may include the status register 133 storing status information. After performing the first program operation, the memory device 100 may store the first failure information in a first bit of the status register 133. When the second program operation starts, the memory device 100 may store the first failure information stored in the first bit of the status register 133 in a second bit of the status register 133, and store the validity information in a third bit of the status register 133. The memory device 100 may store second failure information indicating whether the second program operation passes or fails in the first bit of the status register 133.

According to another embodiment, when the memory controller 200 provides the memory device 100 with a status read command requesting status information, the memory controller 200 may obtain the status information provided in response to the status read command from the memory device 100.

The status information may include the second failure information stored in the first bit of the status register 133, the first failure information stored in the second bit of the status register 133, and the validity information stored in the third bit of the status register 133.

According to another embodiment, the memory controller 200 may determine whether the first failure information stored in the second bit is valid according to the validity information stored in the third bit which is included in the status information.

According to another embodiment, when the validity information stored in the third bit which is included in the status information indicates that the first failure information stored in the second bit is valid and the first failure information stored in the second bit indicates that the first program operation fails, the memory controller 200 may provide the memory device 100 with a program command instructing that data should be stored in another page among the plurality of pages, and the data.

According to another embodiment, the memory system 1000 may include the data buffer 220 temporarily storing data to be stored in the memory device 100. When the validity information stored in the third bit which is included in the status information indicates that the first failure information stored in the second bit is valid and the first failure information stored in the second bit indicates that the first program operation passes, the memory controller 200 may control the data buffer 220 to remove the data stored in the data buffer 220.

According to another embodiment, when the validity information stored in the third bit which is included in the status information indicates that the first failure information stored in the second bit is invalid, the memory controller 200 may provide the memory device 100 with the status read command again.

Figure 5:
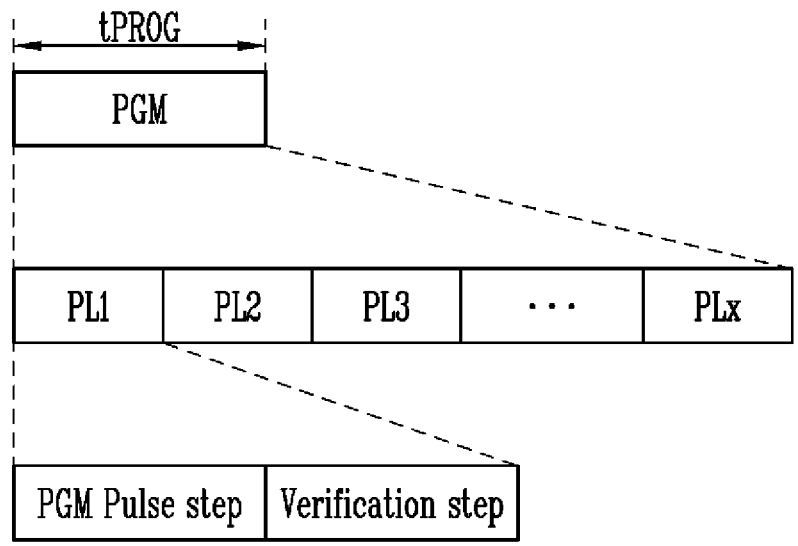
FIG. 5 is a diagram illustrating a program operation.

FIG. 5 is a diagram illustrating a program operation.

Referring to FIG. 5, a program operation PGM may be performed according to a plurality of predetermined sequential program loops PL1 to PLx. Each of the plurality of program loops PL1 to PLx may include a program pulse step (PGM Pulse step) and a verification step (Verification step). The number of plurality of program loops PL1 to PLx may be predetermined. A program operation may be performed for each word line, that is, in units of pages. However, by way of example, it is assumed that a program operation is performed on one memory cell in the context of the following description.

In the PGM Pulse step, a threshold voltage of the memory cell may be changed by applying a program voltage of a predetermined level to a word line. The threshold voltage may refer to a voltage applied to a gate when a channel that allows a current to flow is formed between a source and a drain of the memory cell. Levels of program voltages of the respective program loops PL1 to PLx may sequentially increase according to an order of the plurality of program loops PL1 to PLx, more specifically, toward the program loop PLx.

For example, when the memory device 100 applies the program voltage to the gate of the memory cell coupled to the word line, a tunneling phenomenon may occur and electrons may be stored (or charged) in a floating gate of the memory cell. The threshold voltage of the memory cell may vary depending on the number of electrons in the floating gate.

In the Verification step, it may be identified whether a corresponding program loop passes or fails by applying a verify voltage of a predetermined level to the word line.

More specifically, the memory device 100 may apply the verify voltage to the gate of the memory cell coupled to the word line and sense whether a current flows in a bit line coupled to the memory cell.

For example, when a current flows in the bit line coupled to the memory cell, the memory device 100 may identify that the corresponding program loop fails. This is because when a level of the verify voltage is higher than a level of the threshold voltage, the channel is formed between the source and the drain of the memory cell and the current flows in the bit line through the channel.

When the memory device 100 identifies that the corresponding program loop fails, the memory device 100 may perform a next program loop. For example, when the memory device 100 identifies that a first program loop PL1 fails, the memory device 100 may perform a second program loop PL2 which is the next program loop of the first program loop PL1. When the memory device 100 identifies that the corresponding program loop fails and is the last program loop, that is, the program loop PLx in this example, the memory device 100 may finish the program operation PGM and generate failure information indicating that the program operation PGM for storing data fails. As described above, when a program operation time tPROG for which a program operation is performed passes a predetermined time point, the memory device 100 may generate the failure information indicating that the corresponding program operation PGM fails.

For example, when a current does not flow in the bit line coupled to the memory cell, the memory device 100 may identify that the corresponding program loop passes. This is because when a level of the verify voltage is lower than a level of the threshold voltage, the channel is not formed between the source and the drain of the memory cell and the current does not flow in the bit line.

When the memory device 100 identifies that the corresponding program loop passes, the memory device 100 may finish the program operation PGM and generate the failure information indicating that the program operation PGM for storing data passes.

Figure 6A:
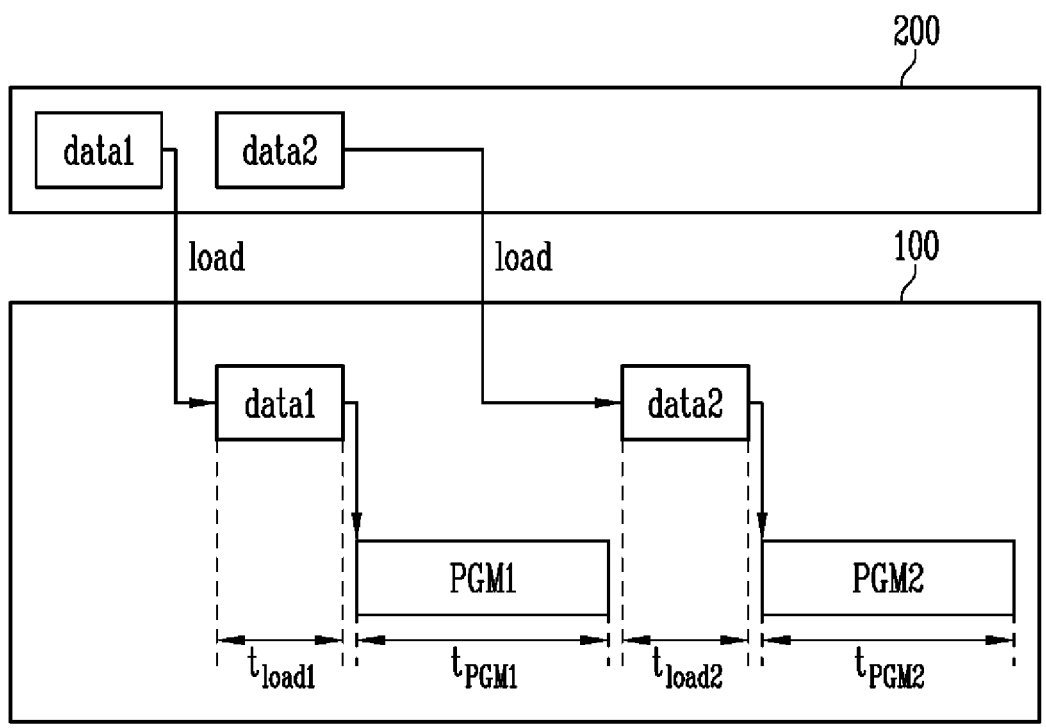
FIG. 6A is a diagram illustrating a normal program method for performing a program operation shown in FIG. 5.

FIG. 6A is a diagram illustrating a normal program method for performing a program operation shown in FIG. 5.

Referring to FIG. 6A, the memory device 100 may perform a program operation by a normal program method.

According to the normal program method, the memory device 100 may sequentially perform an operation for loading first data data1 from the memory controller 200 to one or more page buffers of the read and write circuit 123, a first program operation PGM1 for storing the first data data1 to the memory cell array 110, an operation for loading second data data2 from the memory controller 200 to one or more page buffers of the read and write circuit 123, and a second program operation PGM2 for storing the second data data2 to the memory cell array 110. In other words, the memory device 100 may load new data for a next program operation from the memory controller 200 after the program operation is completed.

As described above, according to the normal program method, a first load time $t_{load1}$ for loading the first data data1, a first program operation time $t_{PGM1}$ for storing the first data data1, a second load time $t_{load2}$ for loading the second data data2, and a second program operation time $t_{PGM2}$ for storing the second data data2 do not overlap each other.

Figure 6B:
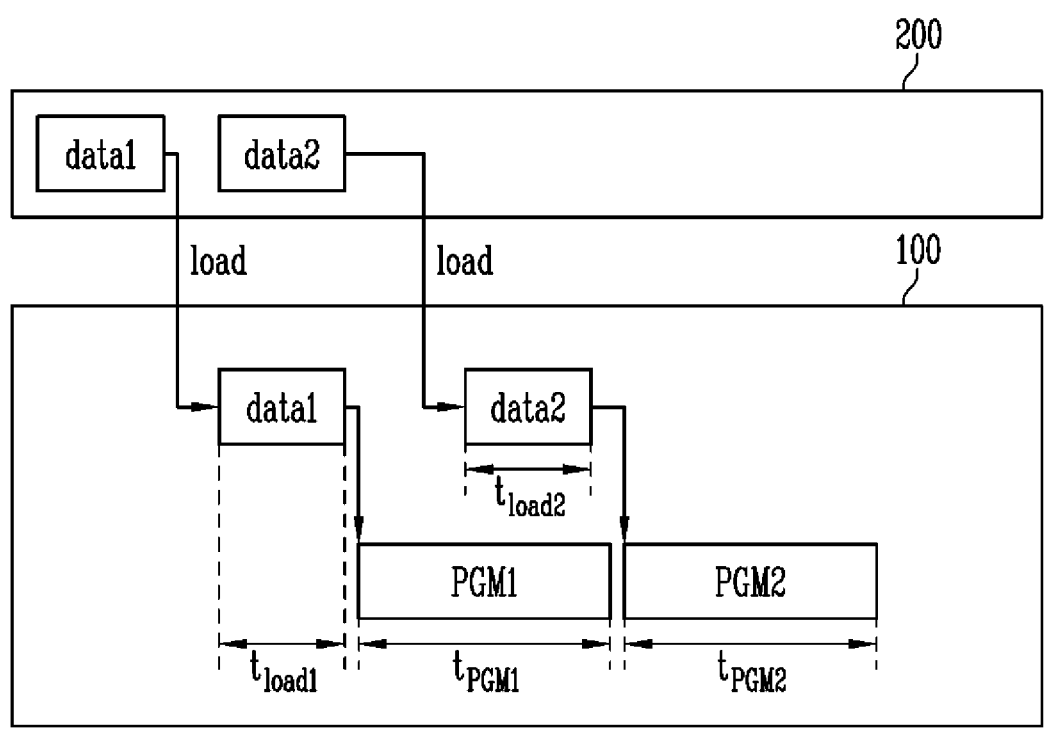
FIG. 6B is a diagram illustrating a cache program method for performing a program operation shown in FIG. 5.

FIG. 6B is a diagram illustrating a cache program method for performing a program operation shown in FIG. 5.

Referring to FIG. 6B, the memory device 100 may perform a program operation by a cache program method.

According to the cache program method, the memory device 100 may perform an operation for loading the first data data1 from the memory controller 200 to one or more page buffers of the read and write circuit 123 or one or more input buffers of the data input/output circuit 124 and the first program operation PGM1 for storing the first data data1 to the memory cell array 110. The memory device 100 may load the second data data2 from the memory controller 200 to one or more page buffers of the read and write circuit 123 or one or more input buffers of the data input/output circuit 124 when the first program operation PGM1 is being performed. After the first program operation PGM1 and the operation for loading the second data data2 are completed, the memory device 100 may perform the second program operation PGM2 for storing the second data data2. In other words, the memory device 100 may load new data for a next program operation from the memory controller 200 when the program operation is being performed.

As described above, according to the cache program method, the first program operation time $t_{PGM1}$ for storing the first data data1 overlaps the second load time $t_{load2}$ for loading the second data data2. Therefore, a program operation time according to the cache program method may be reduced compared to that according to the normal program method.

FIG. 7 is a waveform diagram illustrating an operation of the memory device 100.

Referring to FIG. 7, by way of example, it is assumed that, when the memory device 100 performs an Nth program operation and an (N+1)th program operation by the cache program method, the Nth program operation is the first program operation according to the cache program method and the Nth program operation fails in the context of the following description. The Nth program operation may be for storing Nth page data in an Nth page, and the (N+1)th program operation may be for storing (N+1)th page data in an (N+1)th page.

A data signal DQ[7:0] may indicate data (for example, a command, an address, page data) loaded to the memory device 100 through a data input/output pin. The output signal R/B # may indicate ready information RDY (please refer to FIG. 8) corresponding to an external operation state (a ready state or a busy state) of the memory device 100. An operation state may indicate a performance state of a program operation. An SR code may indicate an operation state of the memory device 100. An output signal CPGM_PRV_SROUTEN may indicate validity information that indicates whether failure information is valid. For example, a first value (e.g., 1) of the validity information indicates that the failure information is valid information. Alternatively, a second value (e.g., 0) of the validity information or a case where a value of the validity information does not exist (e.g., null) indicates that the failure information is invalid information.

Before a time point t1, the memory device 100 may load a cache program command, an address corresponding to the Nth page, and the Nth page data from the memory controller 200. A period during which the SR code is E0h may indicate that both an internal operation state and an external operation state of the memory device 100 are ready states.

At the time point t1, the memory device 100 may start the Nth program operation for storing the Nth page data in the Nth page. From the time point t1 to a time point t6, the memory device 100 may perform the Nth program operation for storing the Nth page data in the Nth page.

During a program cache busy time tCBSY in which the ready information RDY has a value of 0, both the internal operation state and the external operation state of the memory device 100 may be busy states. With respect to the first program operation (that is, the Nth program operation according to this embodiment) according to the cache program method, the program cache busy time tCBSY may refer to a time period between when the program operation starts (the time point t1 according to the embodiment) and when the program operation proceeds to a predetermined extent (a time point t2 according to this embodiment). With respect to a program operation except for the first program operation (that is, the (N+1)th program operation according to this embodiment) according to the cache program method, the program cache busy time tCBSY may refer to a time period between when load of page data to be stored according to a corresponding program operation among previous program operations is completed (a time point t5 according to the embodiment) and when the program operation proceeds to a predetermined extent (a time point t8 according to this embodiment).

The memory device 100 may load an address corresponding to the (N+1)th page and the (N+1)th page data from the memory controller 200 during a time period in which the external operation state of the memory device 100 is the ready state in a time period for which the Nth program operation is performed. For example, the data input/output circuit 124 of the memory device 100 may receive the (N+1)th page data from the memory controller 200 during a time period in which the external operation state of the memory device 100 is the ready state in a time period for which the Nth program operation is performed.

According to one embodiment, a time period during which the SR code is 80h, 81h, or 8Ah may indicate that both the internal operation state and the external operation state of the memory device 100 are busy states. A time period during which the SR code is C0h or CAh may indicate that the internal operation state of the memory device 100 is a busy state and the external operation state of the memory device 100 is a ready state. In other words, in the time period during which the SR code is C0h, the memory device 100 may load an address corresponding to the (N+1)th page and the (N+1)th page data when the Nth program operation is being performed.

When the Nth program operation of the memory device 100 does not pass within a time limit between the time point t1 and the time point t6 (that is, the Nth program operation of the memory device 100 fails), the memory device 100 may finish the Nth program operation at the time point t6. At the time point t6, the memory device 100 may generate failure information indicating that the Nth program operation fails. In one embodiment, during a time period from the time point t6 to the time point t7, the peripheral circuit 120 may erase the Nth page data stored in the read and write circuit 123, and then copy the (N+1)th page data stored in data input/output circuit 124 to the read and write circuit 123.

At a time point t7, the memory device 100 may start the (N+1)th program operation for storing the (N+1)th page data in an address corresponding to the (N+1)th page. At the time point t7, the memory device 100 may generate validity information (i.e., CPGM_PRV_SROUTEN) indicating that failure information is valid information. Before the time point t7 at which the (N+1)th program operation starts, the memory device 100 may generate validity information (i.e., CPGM_PRV_SROUTEN) indicating that the failure information is invalid information.

After the time point t8, the SR code may become CAh and the memory device 100 may keep performing the (N+1)th program operation. The time period during which the SR code is CAh may indicate that the internal operation state of the memory device 100 is a busy state and that the external operation state of the memory device 100 is a ready state. In a time period during which the SR code is EAh, the memory device 100 may finish the (N+1)th program operation. The time period during which the SR code is EAh may indicate that the internal operation state of the memory device 100 is a ready state and the external operation state of the memory device 100 is a ready state.

In FIG. 7, it is illustrated that two program operations such as the Nth program operation and the (N+1)th program operation are successively performed according to a cache program command. However, according to one embodiment, three or more program operations may be successively performed according to the cache program command.

For example, the memory device 100 may successively perform the Nth program operation, the (N+1)th program operation, an (N+2)th program operation, an (N+3)th program operation, and the like according to the cache program command. More specifically, after completing the Nth program operation, the memory device 100 may load (N+2)th page data used for performing the (N+2)th program operation when the (N+1)th program operation is being performed. After finishing the (N+1)th program operation, the memory device 100 may generate failure information indicating whether the (N+1)th program operation passes or fails. After starting the (N+2)th program operation, the memory device 100 may generate validity information indicating whether the failure information of the (N+1)th program operation is valid information to output the failure information and the validity information at the same time. As described above, the descriptions of the Nth program operation and the (N+1)th program operation may be applied to program operations successively performed after the Nth and (N+1)th program operations in the same manner.

Figure 8:
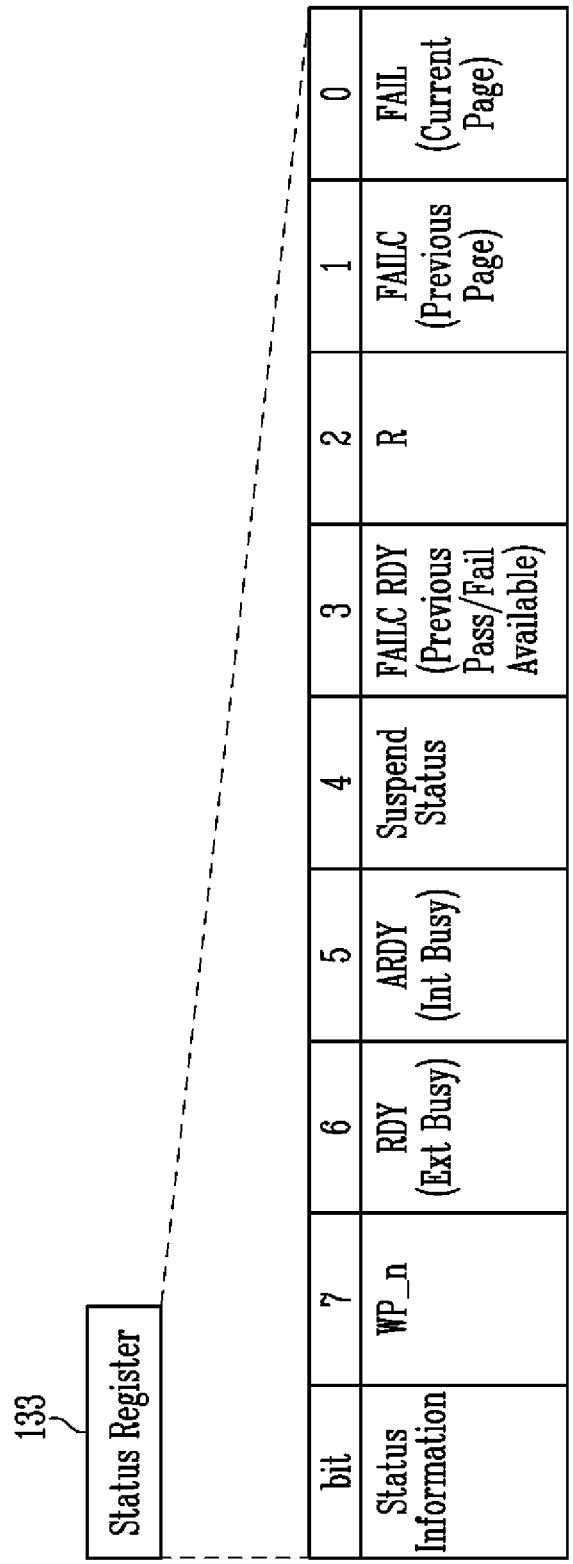
FIG. 8 is a diagram illustrating information stored in a status register according to one embodiment.

FIG. 8 is a diagram illustrating information stored in the status register 133 according to one embodiment.

Referring to FIG. 8, according to one embodiment, the status register 133 may include a memory element of eight bits. Status information may include information stored in each of bit Nos. 0 to 7 of the status register 133.

Failure information FAIL may be stored in the bit No. 0 SR[0] of the status register 133. The failure information FAIL may indicate whether a program operation on a current page passes or fails. For example, when a program operation on the current (N+1)th page is performed, the failure information FAIL indicating whether the program operation on the (N+1)th page passes or fails may be stored in the bit No. 0 of the status register 133.

Failure information FAILC may be stored in the bit No. 1 SR[1] of the status register 133. The failure information FAILC may indicate whether a program operation on a previous page of the current page passes or fails. For example, when a program operation on the current (N+1)th page is performed, the failure information FAILC indicating whether the program operation on the Nth page passes or fails may be stored in the bit No. 1 of the status register 133.

Reserve information R may be stored in the bit No. 2 SR[2] of the status register 133.

Validity information FAILC RDY may be stored in the bit No. 3 SR[3] of the status register 133. The validity information FAILC RDY may indicate whether the failure information FAILC stored in the bit No. 1 SR[1] of the status register 133 is valid information. For example, after the program operation is completed, the validity information FAILC RDY may be generated and stored in the bit No. 3 SR[3] of the status register 133.

Suspend status information Suspend Status about a program or erase operation may be stored in the bit No. 4 SR[4] of the status register 133.

Ready information ARDY may be stored in the bit No. 5 SR[5] of the status register 133. The ready information ARDY may indicate whether an internal operation state of the memory device 100 is a ready state or a busy state. For example, when the internal operation state is a ready state (i.e., when a value of the ready information ARDY is 1), the ready information ARDY may indicate that there is no operation being performed on the memory cell array 110 of the memory device 100. When the internal operation state is a busy state (i.e., when a value of the ready information ARDY is 0), the ready information ARDY may indicate that there is an operation being performed on the memory cell array 110.

The ready information RDY may be stored in the bit No. 6 SR[6] of the status register 133. The ready information RDY may indicate whether an external operation state of the memory device 100 is a ready state or a busy state. For example, when the external operation state is a ready state (i.e., when a value of the ready information RDY is 1), the ready information RDY may indicate that the memory device 100 is in a state capable of loading data such as a command from an external device (for example, the memory controller 200), and subordinate information included in the status information (for example, failure information) is valid information. When the external operation state is a busy state (i.e., when a value of the ready information RDY is 0), the ready information RDY may indicate that the memory device 100 is in a state incapable of loading data from an external device (for example, the memory controller 200), and subordinate information included in the status information (for example, failure information) is invalid information.

According to one embodiment of the present disclosure, the failure information FAILC stored in the bit No. 1 SR[1] may be identified as valid information or invalid information based on the validity information FAILC RDY stored in the bit No. 3 SR[3] but not based on the ready information RDY stored in the bit No. 6 SR[6]. In other words, even when the ready information RDY stored in the bit No. 6 SR[6] indicates a busy state (i.e., when a value of the ready information RDY is 0), the failure information FAILC stored in the bit No. 1 SR[1] may be identified as valid information or invalid information based on the validity information FAILC RDY stored in the bit No. 3 SR[3].

Write protection information WP_n may be stored in the bit No. 7 SR[7] of the status register 133.

According to one embodiment, when the memory device 100 receives a status read command (for example, the SR code which is 70h, 78h, 7Ch, or the like) from the memory controller 200, the memory device 100 may output and provide status information stored in the status register 133 through a data input/output pin to the memory controller 200. Even when the memory device 100 is in a busy state, the memory device 100 may output and provide status information including failure information to the memory controller 200.

Figure 9:
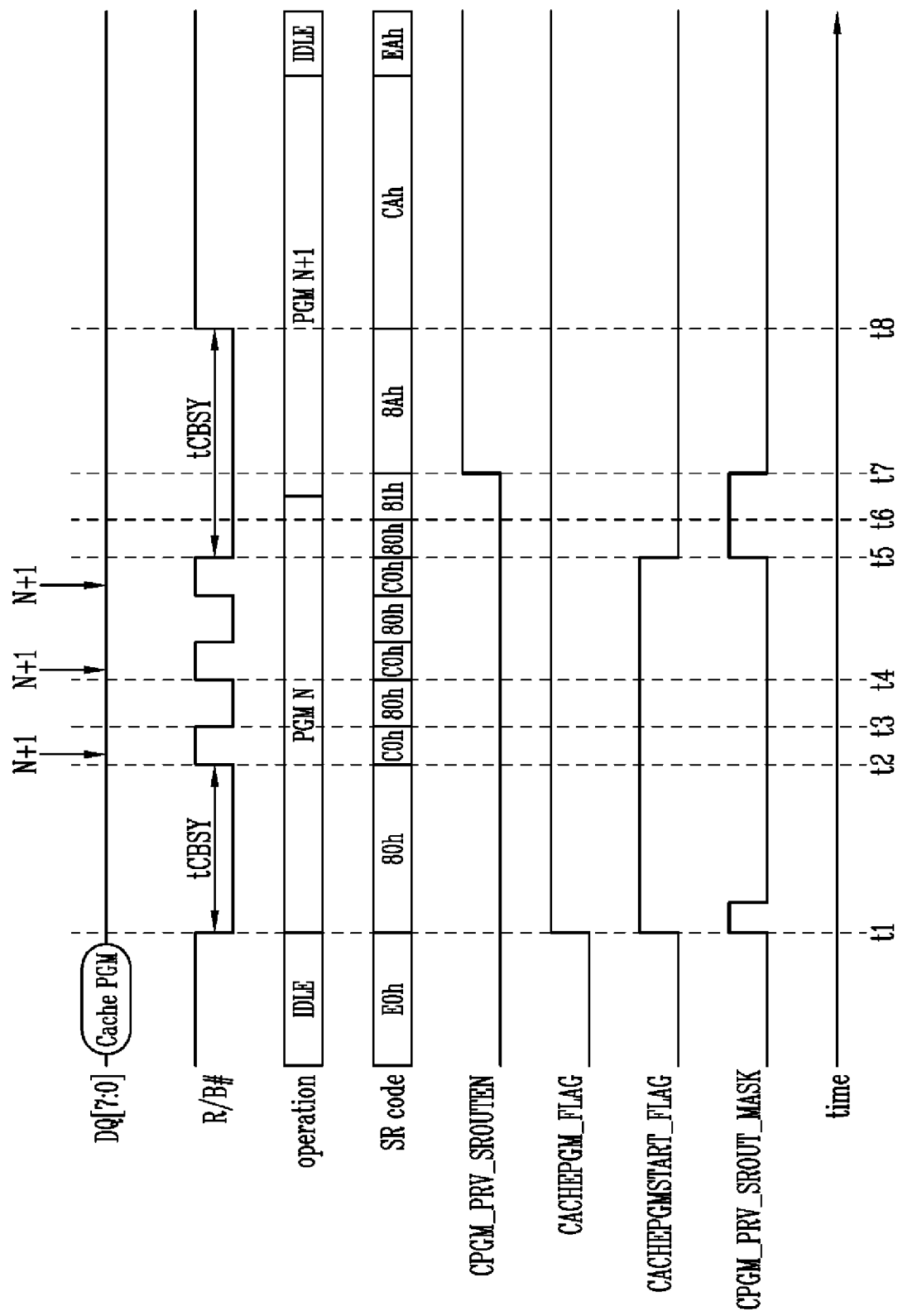
FIG. 9 is a waveform diagram illustrating a method of generating validity information.

FIG. 9 is a waveform diagram illustrating a method of generating validity information.

Referring to FIG. 9, FIG. 9 further illustrates a mask signal CPGM_PRV_SROUT_MASK, a cache program signal CACHEPGM_FLAG and a cache program start signal CACHEPGMSTART_FLAG in addition to the waveform diagram of FIG. 7.

In one embodiment, the output signal CPGM_PRV_SROUTEN indicating the validity information may be enabled when a condition of a case where the Nth program operation is completed and storage of the failure information indicating whether the Nth program operation passes or fails in the second bit (for example, the bit No. 1 SR[1]) of the status register 133 is completed is met. The output signal CPGM_PRV_SROUTEN indicating the validity information may be stored in the third bit (for example, the bit No. 3 SR[3]) of the status register 133. The validity information stored in the third bit of the status register 133 may be output together with the failure information stored in the second bit (for example, the bit No. 1 SR[1]) of the status register 133 in response to the status read command.

According to another embodiment, the output signal CPGM_PRV_SROUTEN indicating the validity information may be generated using the cache program signal CACHEPGM_FLAG and the mask signal CPGM_PRV_SROUT_MASK.

The cache program signal CACHEPGM_FLAG may indicate whether a program operation according to a cache program method is being performed. For example, the cache program signal CACHEPGM_FLAG may be enabled when the Nth program operation or the (N+1)th program operation is being performed according to the cache program method. For example, the cache program signal CACHEPGM_FLAG may be disabled before the time point t1 when the program operation according to the cache program method starts and may be enabled after the time point t1.

The mask signal CPGM_PRV_SROUT_MASK may refer to a signal for masking a specific period. According to one embodiment, the mask signal CPGM_PRV_SROUT_MASK may indicate that the first failure information is invalid for a time period after the time point t5 when the (N+1)th page data is loaded and before the time point t7 when the failure information about the Nth program operation is stored in the second bit (for example, the bit No. 1 SR[1]) of the status register 133. In other words, the mask signal CPGM_PRV_SROUT_MASK may be disabled immediately after the failure information indicating whether the Nth program operation passes or fails is stored in the bit No. 1 SR[1].

As mentioned above, in one embodiment, the output signal CPGM_PRV_SROUTEN indicating the validity information may be generated using the cache program signal CACHEPGM_FLAG and the mask signal CPGM_PRV_SROUT_MASK.

According to another embodiment, the output signal CPGM_PRV_SROUTEN indicating the validity information may be generated using the cache program signal CACHEPGM_FLAG, the cache program start signal CACHEPGMSTART_FLAG and the mask signal CPGM_PRV_SROUT_MASK.

The cache program start signal CACHEPGMSTART_FLAG may indicate whether a program operation is the firstly performed program operation among program operations performed by the cache program method. According to one embodiment, the cache program start signal CACHEPGMSTART_FLAG may be enabled while the firstly performed program operation (e.g., the Nth program operation) is being performed. According to one embodiment, the cache program start signal CACHEPGMSTART_FLAG may be disabled after the next page data for the next program operation (e.g., the (N+1)th program operation) is received. According to another embodiment, the cache program start signal CACHEPGMSTART_FLAG may be disabled while a program operation other than the firstly performed program operation (e.g., the (N+1)th program operation) is being performed. The cache program start signal CACHEPGMSTART_FLAG is enabled or disabled as described above to prevent a user from being confused by invalidating failure information of a previous program operation because the previous program operation of the first program operation does not exist.

According to another embodiment, a reset command (for example, the SR code which is FFh) or a suspend command (for example, the SR code which is 9Ch) is received, the output signal CPGM_PRV_SROUTEN indicating the validity information may be disabled. In other words, when the memory device 100 receives the reset command or the suspend command when the memory device 100 is performing the (N+1)th program operation, the memory device 100 may generate validity information indicating that the failure information of the Nth program operation is invalid. The memory device 100 generates the validity information indicating that the failure information is invalid as described above to prevent the failure information from being processed to be valid even after a reset or suspend operation.

According to another embodiment, when the cache program start signal CACHEPGMSTART_FLAG is enabled, the memory device 100 may initialize the failure information stored in the second bit (for example, the bit No. 1 SR[1]) of the status register 133. The memory device 100 initializes the failure information as described above to remove the failure information according to the previous cache program operation which remains in the second bit of the status register 133 when a new cache program operation is performed.

Figure 10:
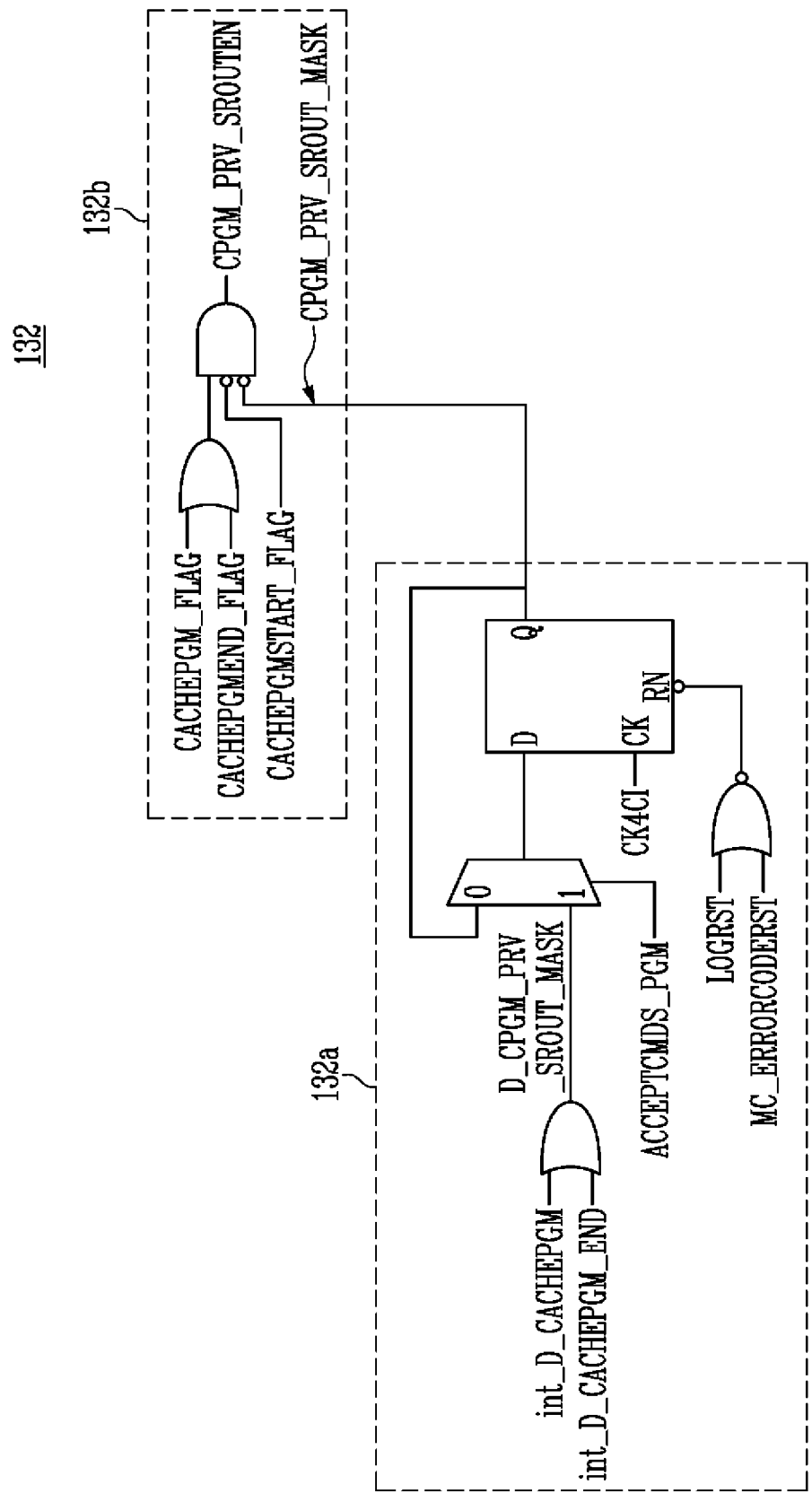
FIG. 10 is a diagram illustrating a configuration of a status register controller generating validity information of FIG. 9.

FIG. 10 is a diagram illustrating a configuration of the status register controller 132 generating validity information of FIG. 9.

Referring to FIG. 10, according to one embodiment, the status register controller 132 may include a mask signal generating circuit 132a and a validity information generating circuit 132b. According to one embodiment, each of the mask signal generating circuit 132a and the validity information generating circuit 132b may include various logic devices such as AND, NOT, OR, XOR, NAND, NOR gates, flip-flops, delay devices, and the like. For example, the mask signal generating circuit 132a and the validity information generating circuit 132b may be configured as logic circuits in a form of the embodiment shown in FIG. 10.

The mask signal generating circuit 132a may generate the mask signal CPGM_PRV_SROUT_MASK. The mask signal CPGM_PRV_SROUT_MASK may indicate that the first failure information is invalid during a time period between when the second page data is loaded and when the first failure information is stored in the second bit of the status register. The mask signal generating circuit 132a may output and transfer the mask signal CPGM_PRV_SROUT_MASK to the validity information generating circuit 132b.

The validity information generating circuit 132b may generate the validity information based on the cache program signal CACHEPGM_FLAG and the mask signal CPGM_PRV_SROUT_MASK. In other words, the validity information generating circuit 132b may generate the output signal CPGM_PRV_SROUTEN indicating the validity information.

According to one embodiment, the validity information generating circuit 132b may generate the output signal CPGM_PRV_SROUTEN indicating the validity information based on the cache program signal CACHEPGM_FLAG, the cache program start signal CACHEPGMSTART_FLAG, and the mask signal CPGM_PRV_SROUT_MASK.

Figure 11:
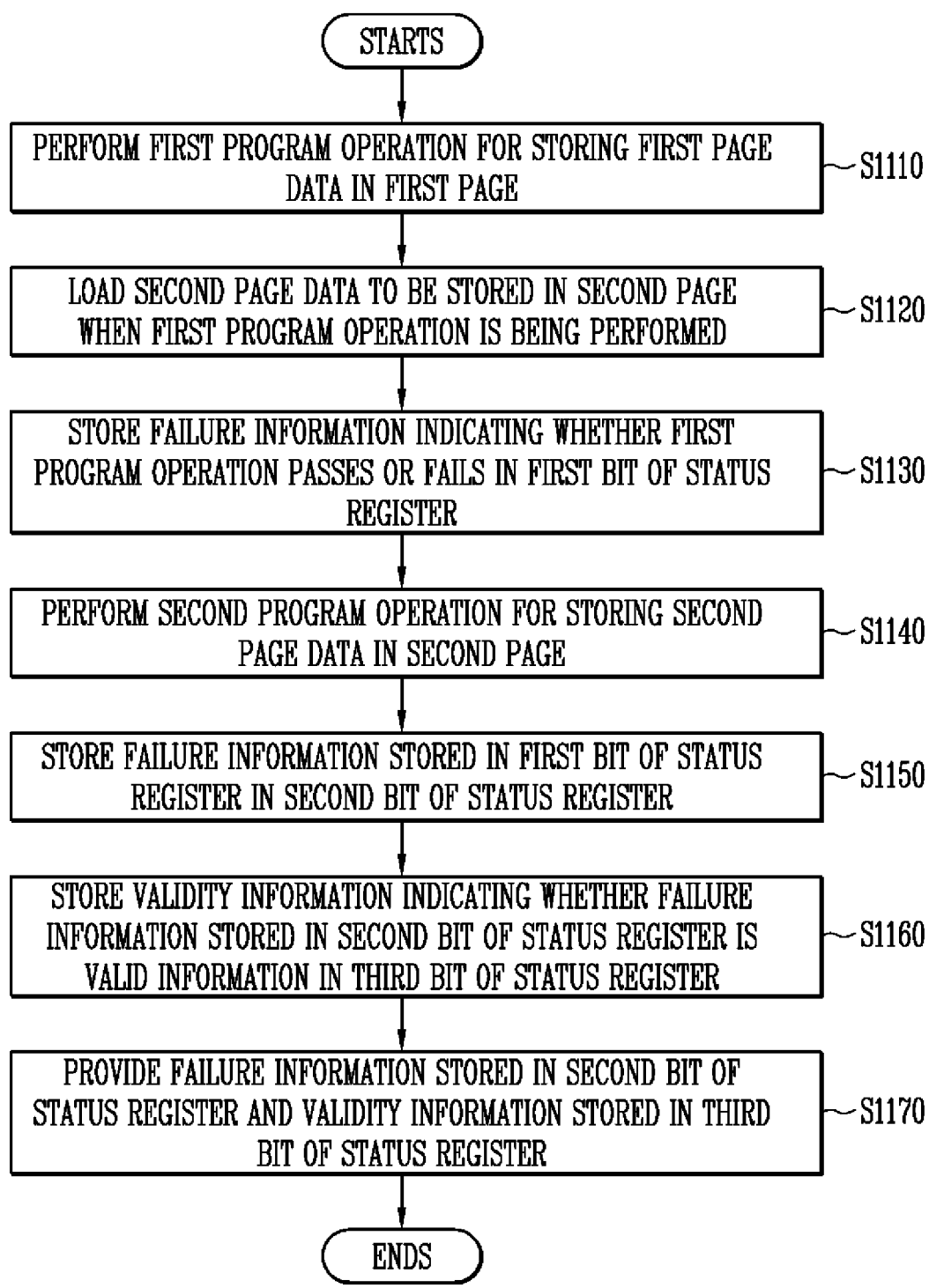
FIG. 11 is a flowchart illustrating an operation of a memory device.

FIG. 11 is a flowchart illustrating an operation of the memory device 100.

Referring to FIG. 11, the memory device 100 may perform a first program operation for storing first page data in a first page corresponding to an address (S1110). According to one embodiment, when the memory device 100 receives a command, an address, and the first page data used for performing a cache program operation from the memory controller 200, the memory device 100 may perform the first program operation for storing the first page data in the first page corresponding to the address.

When the first program operation is being performed, the memory device 100 may load second page data to be stored in a second page from the memory controller 200 (S1120). According to another embodiment, when the first program operation is being performed, the load of the second page data may be completed.

After performing the first program operation, the memory device 100 may store failure information indicating whether the first program operation passes or fails in a first bit of the status register 133 (S1130). According to another embodiment, a value indicating whether the first program operation passes or fails may be stored in the first bit of the status register 133.

The memory device 100 may perform a second program operation for storing the second page data in the second page (S1140). According to another embodiment, when the first program operation and the load of the second page data are completed, the memory device 100 may perform the second program operation.

The memory device 100 may store the failure information stored in the first bit of the status register 133 in a second bit of the status register 133 (S1150). According to another embodiment, when the second program operation starts, the memory device 100 may store the failure information stored in the first bit of the status register 133 in the second bit of the status register 133.

The memory device 100 may store validity information indicating whether the failure information stored in the second bit of the status register 133 is valid information in a third bit of the status register 133 (S1160). Step S1160 may be performed after or simultaneously with step S1150.

The memory device 100 may provide the memory controller 200 with the failure information stored in the second bit of the status register 133 and the validity information stored in the third bit of the status register 133 (S1170). According to another embodiment, when the memory device 100 receives a status read command from the memory controller 200, the memory device 100 may provide status information to the memory controller 200 as a response to the status read command. The status information may include the failure information stored in the second bit of the status register 133 and the validity information stored in the third bit of the status register 133. In addition, the status information may include the failure information stored in the first bit of the status register 133 and the ready information RDY stored in a fourth bit of the status register 133.

Figure 12:
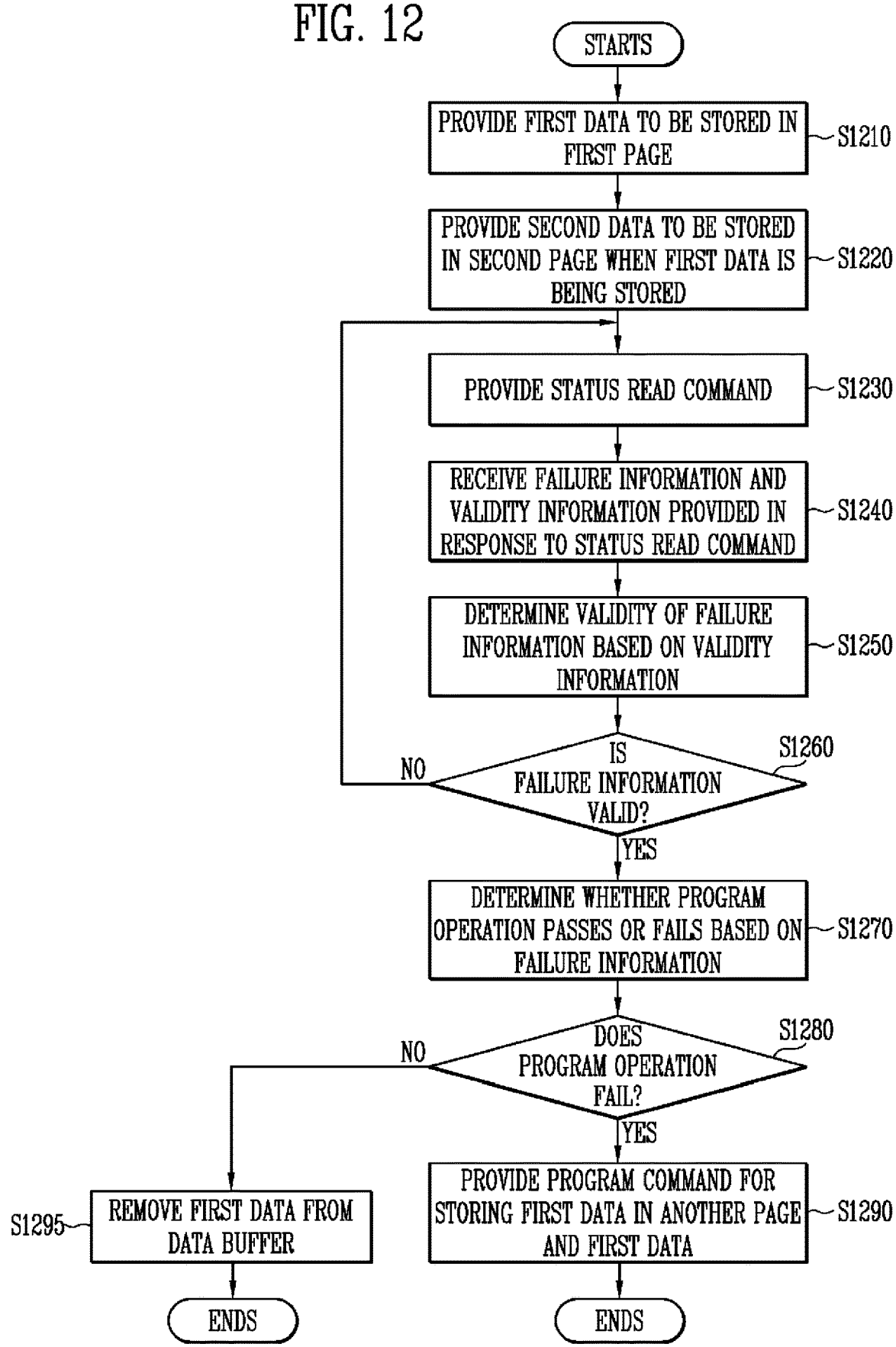
FIG. 12 is a flowchart illustrating an operation of a memory controller.

FIG. 12 is a flowchart illustrating an operation of the memory controller 200.

Referring to FIG. 12, the memory controller 200 may provide the memory device 100 with first data (first page data) to be stored in a first page of the memory device 100 (S1210). According to one embodiment, the memory controller 200 may provide the memory device 100 with a command, an address, and the first data used for performing a cache program operation. When the memory device 100 receives the command, the address, and the first data for the cache program operation, the memory device 100 may perform a first program operation for storing the first data in a page corresponding to the address.

When the first data is being stored in the memory device 100, the memory controller 200 may provide the memory device 100 with second data (second page data) to be stored in a second page of the memory device 100 (S1220). According to another embodiment, when the first program operation for storing the first data is being performed in the memory device 100, the memory controller 200 may provide the memory device 100 with the second data to be stored in the second page of the memory device 100.

The memory controller 200 may provide a status read command to the memory device 100 (S1230). The memory controller 200 may receive failure information and validity information from the memory device 100 as a response to the status read command (S1240). According to another embodiment, the memory controller 200 may receive status information including the failure information and the validity information from the memory device 100.

The memory controller 200 may determine validity of the failure information based on the validity information (S1250). The memory controller 200 may identify validity of failure information stored in the second bit of the status register 133 according to validity information stored in the third bit of the status register 133.

According to another embodiment, when the memory controller 200 receives the status information including the failure information and the validity information from the memory device 100 before a second program operation is performed, a value of the validity information stored in the third bit of the status register 133 may indicate that the failure information stored in the second bit of the status register 133 is invalid information. As described above, when the memory controller 200 identifies that the failure information is invalid (a result of operation S1260 is No), the memory controller 200 may provide the status read command to the memory device 100 (S1230).

According to another embodiment, when the memory controller 200 receives the status information including the failure information and the validity information from the memory device 100 after the second program operation is performed, a value of the validity information stored in the third bit of the status register 133 may indicate that the failure information stored in the second bit of the status register 133 is valid information. As described above, when the memory controller 200 identifies that the failure information is valid (a result of operation S1260 is Yes), the memory controller 200 may determine whether a program operation passes or fails based on the failure information (S1270). The memory controller 200 may determine whether the program operation passes or fails based on the failure information stored in the second bit of the status register 133.

When the memory controller 200 identifies that the program operation fails (a result of operation S1280 is Yes), the memory controller 200 may provide the memory device 100 with a program command for storing the first data in another page and the first data (S1290). The term "another page" may refer to a page different from the second page or a page different from the first and second pages.

When the memory controller 200 identifies that the program operation passes (a result of operation S1280 is No), the memory controller 200 may remove the first data from the data buffer 220 (S1295). In other words, the memory controller 200 may secure a resource of the data buffer 220 by deleting the first data stored in the data buffer 220.

Figure 13:
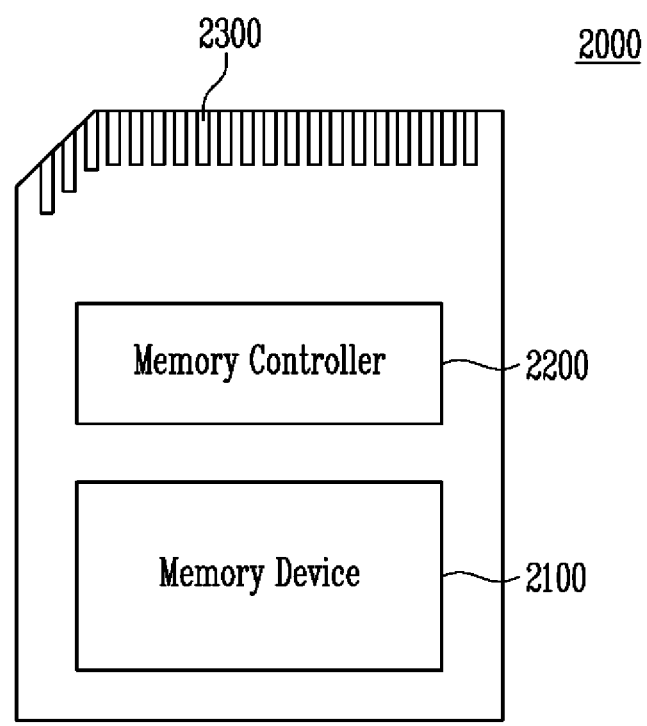
FIG. 13 is a block diagram illustrating a memory card to which a memory system is applied according to one embodiment of the present disclosure.

FIG. 13 is a block diagram illustrating a memory card 2000 to which a memory system is applied according to one embodiment of the present disclosure.

Referring to FIG. 13, the memory card 2000 may include a memory device 2100, a memory controller 2200, and a connector 2300.

The memory device 2100 may perform a program operation for storing data. In one embodiment, the memory device 2100 may include various nonvolatile memory elements such as Electrically Erasable and Programmable ROM (EEPROM), NAND flash memory, NOR flash memory, Phase-change RAM (PRAM), Resistive RAM (ReRAM), Ferroelectric RAM (FRAM), and Spin-Transfer Torque Magnetic RAM (STT-MRAM). The descriptions of the memory device 100 set forth above with reference to FIG. 1 and the like may be applied to the memory device 2100 in the same manner, and repetitive descriptions are omitted.

The memory controller 2200 may access the memory device 2100. For example, the memory controller 2200 may be configured to control program, read, and erase operations of the memory device 2100. The memory controller 2200 may be configured to provide an interface between the memory device 2100 and a host. The memory controller 2200 may be configured to drive instructions such as firmware for controlling the memory device 2100. The memory controller 2200 may have the same configuration as the memory controller 200 described above with reference to FIG. 1.

In one embodiment, the memory controller 2200 may include components, such as a Random Access Memory (RAM), a processing unit, a host interface, a memory interface, and an error correction code (ECC) block.

The memory controller 2200 may communicate with an external device through the connector 2300. The memory controller 2200 may communicate with an external device (e.g., a host) based on a specific communication protocol. In one embodiment, the memory controller 2200 may communicate with the external device through at least one of various communication protocols such as Universal Serial Bus (USB), multimedia card (MMC), embedded MMC (eMMC), peripheral component interconnection (PCI), PCI Express (PCI-e), Advanced Technology Attachment (ATA), Serial-ATA (SATA), Parallel-ATA (PATA), Small Computer System Interface (SCSI), Enhanced Small Disk Interface (ESDI), Integrated Drive Electronics (IDE), Firewire, Universal Flash Storage (UFS), WiFi, Bluetooth, and NonVolatile Memory express (NVMe) protocols. For example, the connector 2300 may be defined by at least one of the above-described various communication protocols.

The memory device 2100 and the memory controller 2200 may be integrated into a single semiconductor device to form a memory card. For example, the memory device 2100 and the memory controller 2200 may be integrated into a single semiconductor device and form a memory card such as a Personal Computer Memory Card International Association (PCMCIA), a compact flash (CF) card, a smart media card (SM or SMC), a memory stick, a multimedia card (MMC, RS-MMC, MMCmicro, or eMMC), an SD card (SD, miniSD, microSD, or SDHC), a universal flash storage (UFS), and the like.

Figure 14:
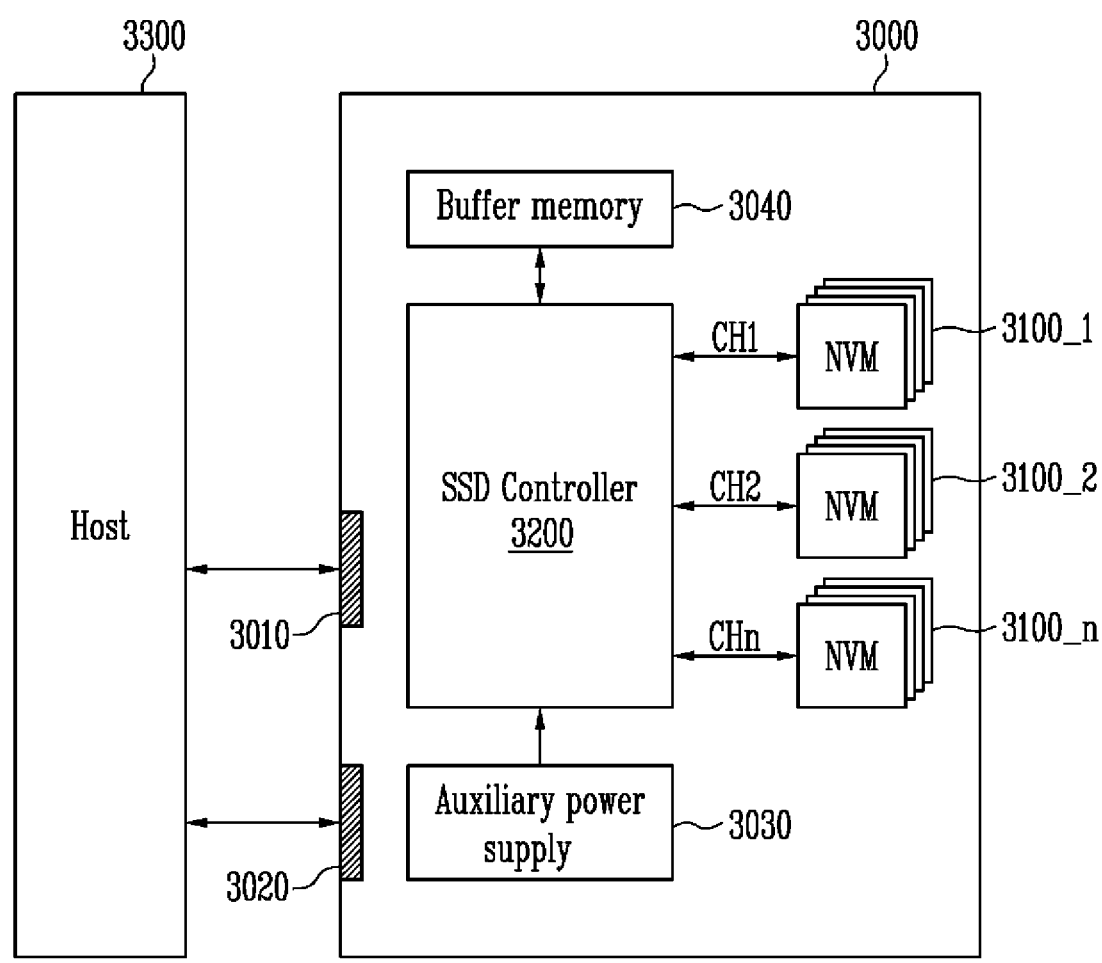
FIG. 14 is a block diagram illustrating a solid state drive (SSD) system to which a memory system is applied according to one embodiment of the present disclosure.

FIG. 14 is a block diagram illustrating a solid state drive (SSD) system 3000 to which a memory system is applied according to one embodiment of the present disclosure.

Referring to FIG. 14, the SSD system 3000 may exchange signals with a host 3300 through a signal connector 3010 and may receive power through a power connector 3020. The SSD system 3000 may include a plurality of flash memory 3100_1 to 3100_n, an SSD controller 3200, an auxiliary power supply 3030, and buffer memory 3040.

According to one embodiment, the SSD controller 3200 may perform the function of the memory controller 200 described above with reference to FIG. 1.

The SSD controller 3200 may control the plurality of flash memory 3100_1 to 3100_n in response to the signals received from the host 3300. In one embodiment, the signals may be based on the type of interfaces of the host 3300 and the SSD system 3000. For example, the signals may be defined by at least one of various interfaces such as Universal Serial Bus (USB), multimedia card (MMC), embedded MMC (eMMC), peripheral component interconnection (PCI), PCI Express (PCI-e), Advanced Technology Attachment (ATA), Serial-ATA (SATA), Parallel-ATA (PATA), Small Computer System Interface (SCSI), Enhanced Small Disk Interface (ESDI), Integrated Drive Electronics (IDE), Firewire, Universal Flash Storage (UFS), WiFi, Bluetooth, and NonVolatile Memory express (NVMe) interfaces.

The auxiliary power supply 3030 may be coupled to the host 3300 through the power connector 3020. The auxiliary power supply 3030 may be supplied and charged with power from the host 3300. The auxiliary power supply 3030 may supply power of the SSD system 3000 when power is not smoothly supplied from the host 3300. For example, the auxiliary power supply 3030 may be disposed within or external to the SSD system 3000. For example, the auxiliary power supply 3030 may be disposed on a main board and may supply auxiliary power to the SSD system 3000.

The buffer memory 3040 may operate as buffer memory of the SSD system 3000. For example, the buffer memory 3040 may temporarily store data received from the host 3300 or data received from the plurality of flash memory 3100_1 to 3100_n, or may temporarily store metadata (e.g., mapping tables) of the plurality of flash memory 3100_1 to 3100_n. The buffer memory 3040 may include volatile memory such as DRAM, SDRAM, DDR SDRAM, LPDDR SDRAM, and GRAM or nonvolatile memory such as FRAM, ReRAM, STT-MRAM, and PRAM.

Figure 15:
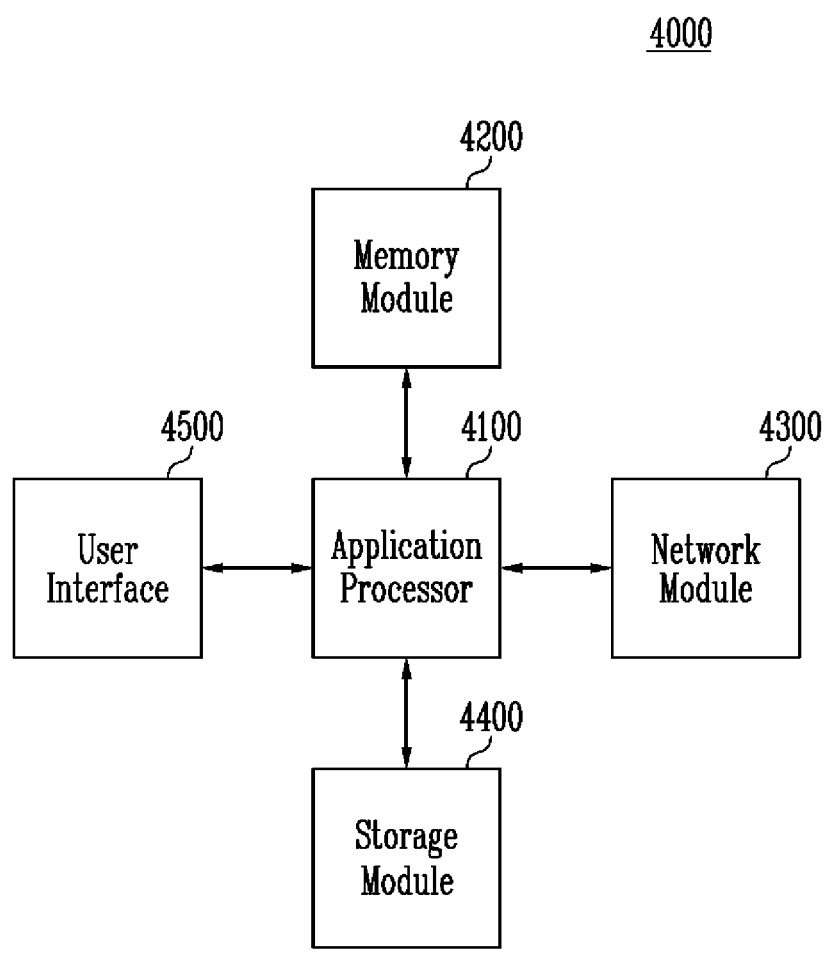
FIG. 15 is a block diagram illustrating a user system to which a memory system is applied according to one embodiment of the present disclosure.

FIG. 15 is a block diagram illustrating a user system 4000 to which a memory system is applied according to one embodiment of the present disclosure.

Referring to FIG. 15, the user system 4000 may include an application processor 4100, a memory module 4200, a network module 4300, a storage module 4400, and a user interface 4500.

The application processor 4100 may run components included in the user system 4000, an operating system (OS), or a user program. For example, the application processor 4100 may include controllers, interfaces, graphic engines, and the like, for controlling the components included in the user system 4000. The application processor 4100 may be provided as a system on chip (SoC).

The memory module 4200 may function as main memory, operational memory, buffer memory, or cache memory of the user system 4000. The memory module 4200 may include volatile random access memory such as DRAM, SDRAM, DDR SDRAM, DDR2 SDRAM, DDR3 SDRAM, LPDDR SDRAM, LPDDR2 SDRAM, and LPDDR3 SDRAM or nonvolatile random access memory such as PRAM, ReRAM, MRAM, and FRAM. For example, the application processor 4100 and the memory module 4200 may be packaged based on package on package (POP) and may then be provided as a single semiconductor package.

The network module 4300 may communicate with external devices. For example, the network module 4300 may support wireless communication, such as a Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or Wi-Fi communication. For example, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. According to one embodiment, the storage module 4400 may be implemented as a nonvolatile semiconductor memory element, such as Phase-change RAM (PRAM), Magnetic RAM (MRAM), Resistive RAM (RRAM), NAND flash memory, NOR flash memory, or NAND flash memory having a three-dimensional (3D) structure. For example, the storage module 4400 may be provided as a removable storage medium (i.e., a removable drive), such as a memory card or an external drive of the user system 4000.

According to one embodiment, the storage module 4400 may include a plurality of nonvolatile memory devices, and the plurality of nonvolatile memory devices may be operated in the same manner as the nonvolatile memory device 100 described above with reference to FIG. 1. The storage module 4400 may operate in the same manner as the memory system 1000 described above with reference to FIG. 1.

The user interface 4500 may include interfaces which input data or commands to the application processor 4100 or output data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

According to one embodiment, the operating method of the memory device 100 may include performing a first operation of processing first data while receiving second data; performing, when the first operation is completed, a second operation of processing the second data, while generating a first signal indicating whether the first operation succeeds or fails and enabling a second signal indicating that the first signal is valid; and providing the memory controller 200 with the first signal and the second signal, which is enabled or disabled, in response to a request from the memory controller 200.

According to one embodiment, the second signal may be enabled for a time from when the second operation starts to when the memory device 100 becomes able to load data.

According to one embodiment, the operating method may further include disabling the enabled second signal in response to a reset command or a suspend command from the memory controller 200.

According to various embodiments of the present disclosure, a memory system including a memory device that more quickly provides whether a cache program operation passes or fails than a conventional memory device and a method of operating the memory system may be provided.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form based on the methods (or operations of the computer, processor, controller, or other signal processing device) are described, the code or instructions for implementing the operations of the method embodiments may transform the computer, processor, controller, or other signal processing device into a special-purpose processor to perform the methods herein.

When implemented in at least partially in software, the controllers, processors, devices, modules, performers, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Although various embodiments have been described for illustrative purposes, it will be apparent to those skilled in the art that various changes and modifications may be made without departing from the spirit and scope of the disclosure as defined in the following claims.

What is claimed is:

1. A memory device, comprising:
a memory block including a plurality of pages;
a peripheral circuit configured to perform a first program operation for storing first page data in a first page among the plurality of pages and perform a second program operation for storing second page data in a second page among the plurality of pages after the first program operation;
a status register configured to store status information including information related to each of the first program operation and the second program operation;
a cache program operation controller configured to control the peripheral circuit to load the second page data from an external controller while the first program operation is performed; and
a status register controller configured to:
store, in the status register, first failure information indicating whether the first program operation passes or fails after the second program operation starts;
store, in the status register, a first value of validity information indicating that the first failure information is valid within a predetermined time period from when the second program operation starts; and
provide the external controller with the status information including the first failure information and the first value of the validity information which is stored in the status register,
wherein the status register controller is configured to provide the external controller with a second value of the validity information indicating that the first failure information is invalid, during a time period between when the second page data is loaded and when the first failure information is stored in the status register.

2. The memory device of claim 1, wherein the predetermined time period is a time period from when the second program operation starts to when a state of the peripheral circuit is changed from a busy state incapable of loading data to a ready state capable of loading the data.

3. The memory device of claim 1, wherein the status register controller is configured to:
store the first failure information in a first bit of the status register after the first program operation ends;
store the first failure information stored in the first bit of the status register in a second bit of the status register; and
store the validity information in a third bit of the status register within the predetermined time period from when the second program operation starts.

4. The memory device of claim 3, wherein the status information includes the first failure information stored in the second bit of the status register and the validity information stored in the third bit of the status register.

5. The memory device of claim 3, wherein the status register controller comprises:
a mask signal generating circuit configured to generate a mask signal indicating that the first failure information is invalid during the time period between when the second page data is loaded and when the first failure information is stored in the second bit of the status register; and
a validity information generating circuit configured to generate the validity information based on a cache program signal indicating progress status of the first program operation or the second program operation and the mask signal.

6. The memory device of claim 3,
wherein the status register controller is further configured to store second failure information indicating whether the second program operation passes or fails in the first bit of the status register after the second program operation starts, and
wherein the status information includes the second failure information stored in the first bit of the status register.

7. The memory device of claim 1, wherein the status register controller is configured to:
store, when the first program operation is completed within a predetermined time limit, the first failure information indicating that the first program operation for storing the first page data in the first page passes in the status register; and
store, when the first program operation is not completed within the predetermined time limit, the first failure information indicating that the first program operation for storing the first page data in the first page fails in the status register.

8. A memory controller configured to control a memory device including a plurality of pages, the memory controller comprising:
a data buffer configured to store page data to be stored in the memory device; and
a processor configured to:
provide the memory device with first page data to be stored in a first page among the plurality of pages;

provide the memory device with second page data to be stored in a second page while the memory device performs a first program operation for storing the first page data; and obtain status information indicating an internal state of the memory device from the memory device before the memory device ends a second program operation for storing the second page data, wherein the status information includes failure information indicating whether the first program operation passes or fails and validity information indicating whether the failure information is valid or invalid, and wherein the processor is further configured to:

obtain a first value of the validity information, indicating that the failure information is invalid, during a time period between when the second page data is provided to the memory device and when the memory device starts the second program operation; and obtain a second value of the validity information, indicating that the failure information is valid, after the memory device starts the second program operation.

9. The memory controller of claim 8, wherein the processor is further configured to provide the memory device with a status read command for requesting the status information, and wherein the processor obtains the status information, which is provided in response to the status read command.

10. The memory controller of claim 9, wherein the processor is further configured to:

provide the memory device with the status read command for requesting the status information, and obtain the status information, which is provided within a predetermined time period in response to the status read command, and wherein the predetermined time period is a time period from when the second program operation starts to when a state of the memory device is changed from a busy state incapable of loading data to a ready state capable of loading the data.

11. The memory controller of claim 9, wherein the processor is further configured to:

when a value of the validity information is the first value, provide the memory device with the status read command again, and obtain the status information, which indicates a current internal state of the memory device.

12. The memory controller of claim 8, wherein, when a value of the validity information is the second value and the failure information indicates that the first program operation fails, the processor is further configured to provide the memory device with the first page data and a program command to control the memory device to store the first page data in another page among the plurality of pages.

13. The memory controller of claim 8, wherein, when a value of the validity information is the second value and the failure information indicates that the first program operation passes, the processor is further configured to control the data buffer to remove the first page data from the data buffer.

14. A memory system, comprising:

a memory device configured to:

while a first program operation for storing first data in a selected page among a plurality of pages is performed, load second data to be stored in a next page of the selected page; and perform a second program operation for storing the second data in the next page after the first program operation ends; and a memory controller configured to obtain status information including first failure information indicating whether the first program operation passes or fails and validity information indicating whether the first failure information is valid, the status information being provided from the memory device, wherein the validity information, which is provided from the memory device within a predetermined time period from when the second program operation starts, comprises a first value indicating that the first failure information is valid, and wherein the validity information, which is provided from the memory device during a time period between when the second data is loaded and when the second program operation starts, comprises a second value indicating that the first failure information is invalid.

15. The memory system of claim 14, wherein the predetermined time period is a time period from when the second program operation starts to when a state of the memory device is changed from a busy state incapable of loading data to a ready state capable of loading the data.

16. The memory system of claim 14, wherein the memory device includes a status register configured to store the status information, wherein the memory device is further configured to:

store the first failure information in a first bit of the status register after the first program operation ends, store the first failure information stored in the first bit of the status register in a second bit of the status register, store the validity information in a third bit of the status register, and store second failure information indicating whether the second program operation passes or fails in the first bit of the status register when the second program operation starts, and wherein the status information includes the second failure information stored in the first bit of the status register, the first failure information stored in the second bit of the status register, and the validity information stored in the third bit of the status register.

17. The memory system of claim 16, wherein the memory controller is further configured to determine whether the first failure information stored in the second bit is valid based on the validity information stored in the third bit.

18. The memory system of claim 17, wherein, when the validity information comprises the first value and the first failure information indicates that the first program operation fails, the memory controller is further configured to provide the memory device with the first data and a program command to control the memory device to store the first data in another page among the plurality of pages.

19. The memory system of claim 17, further comprising a data buffer configured to temporarily store the first data or the second data to be stored in the memory device, wherein, when the validity information comprises the first value and the first failure information indicates that the first program operation passes, the memory controller is further configured to control the data buffer to remove the first data therefrom.

20. The memory system of claim 17, wherein the memory controller is further configured to provides the memory device with a status read command for requesting the status information, wherein the memory controller obtains the status information, which is provided from the memory device in response to the status read command, and wherein the memory controller is further configured to provide, when the validity information comprises the second value, the memory device with the status read command again.

\* \* \* \* \*